US011374494B2

(12) United States Patent
Shlomo

(10) Patent No.: US 11,374,494 B2
(45) Date of Patent: Jun. 28, 2022

(54) GENERAL-PURPOSE ANALOG SWITCH WITH A CONTROLLED DIFFERENTIAL EQUALIZATION VOLTAGE-SLOPE LIMIT

(71) Applicant: Cypress Semiconductor Corporation, San Jose, CA (US)

(72) Inventor: Oren Shlomo, Haifa (IL)

(73) Assignee: INFINEON TECHNOLOGIES LLC, San Jose, CA (US)

( * ) Notice: Subject to any disclaimer, the term of this patent is extended or adjusted under 35 U.S.C. 154(b) by 174 days.

(21) Appl. No.: 16/823,528

(22) Filed: Mar. 19, 2020

(65) Prior Publication Data

US 2020/0304024 A1    Sep. 24, 2020

Related U.S. Application Data

(60) Provisional application No. 62/821,880, filed on Mar. 21, 2019.

(51) Int. Cl.
*H02M 3/158* (2006.01)
*H02M 1/00* (2006.01)

(52) U.S. Cl.
CPC .......... *H02M 3/158* (2013.01); *H02M 1/0009* (2021.05); *H02M 1/0029* (2021.05)

(58) Field of Classification Search
CPC ............. H02M 1/0003; H02M 1/0009; H02M 1/0029; H02M 1/008; H02M 3/156; H02M 3/158; H03K 17/163; H03K 2217/0009; H03K 2217/0054
See application file for complete search history.

(56) References Cited

U.S. PATENT DOCUMENTS

| 4,325,021 A | 4/1982 | McMackin |
| 4,477,896 A | 10/1984 | Aker |
| 4,947,063 A | 8/1990 | O'Shaughnessy et al. |
| 5,059,814 A * | 10/1991 | Mead ................... G06N 3/0635 |
| | | 706/33 |

(Continued)

FOREIGN PATENT DOCUMENTS

| DE | 4031895 A1 | 4/1991 |
| EP | 266561 B1 | 2/1992 |

OTHER PUBLICATIONS

International Search Report for International Application No. PCT/US2020/023851 dated Jun. 22, 2020; 2 pages.

(Continued)

*Primary Examiner* — Matthew V Nguyen

(57) ABSTRACT

A differential-slope-limiting-switch and method are provided. Generally, the switch includes a first transistor having a first source-drain (SD) and well coupled to a first port of the switch, a gate, and a second SD, and a second transistor having a first SD and well coupled to a second port, a gate, and a second SD coupled to the second SD of the first transistor. A selector-circuit couples the gate of the first transistor to a first current-source when a signal to close the switch is received, and to the first port when it is not received. A second selector-circuit couples the gate of the second transistor to a second current-source when the signal is received, or to the second port. First and second feedback-capacitors couple each gate to the port on opposite sides of the switch and with the current-sources limit a slope of voltage transitions across the closed switch.

20 Claims, 21 Drawing Sheets

(56) References Cited

U.S. PATENT DOCUMENTS

| | | | |
|---|---|---|---|
| 7,502,235 B2 * | 3/2009 | Huang | H02M 1/32 363/21.01 |
| 7,595,624 B2 | 9/2009 | Tateishi et al. | |
| 8,527,574 B2 | 9/2013 | Janot | |
| 8,638,074 B2 | 1/2014 | Babcock et al. | |
| 9,287,772 B2 | 3/2016 | Hussien et al. | |
| 10,158,288 B2 | 12/2018 | Mengad | |
| 10,461,732 B1 | 10/2019 | Norling et al. | |
| 10,491,207 B2 | 11/2019 | Norling et al. | |
| 2009/0108911 A1 | 4/2009 | Nakahara et al. | |
| 2013/0187695 A1 * | 7/2013 | Koehler | H03K 17/0828 327/170 |
| 2015/0171861 A1 | 6/2015 | Aherne | |
| 2015/0177798 A1 | 6/2015 | Venishetti et al. | |
| 2015/0263007 A1 | 9/2015 | Yamazaki et al. | |
| 2016/0043720 A1 | 2/2016 | Kubota et al. | |
| 2020/0304024 A1 * | 9/2020 | Shlomo | H03K 17/163 |
| 2020/0395924 A1 * | 12/2020 | Ou | H03K 3/356104 |

OTHER PUBLICATIONS

Written Opinion of the International Searching Authority for International Application No. PCT/US2020/023851 dated Jun. 22, 2020; 6 pages.

"Slope Compensation," Science Direct, Jan. 2020, pp. 1-7; 7 pages.

* cited by examiner

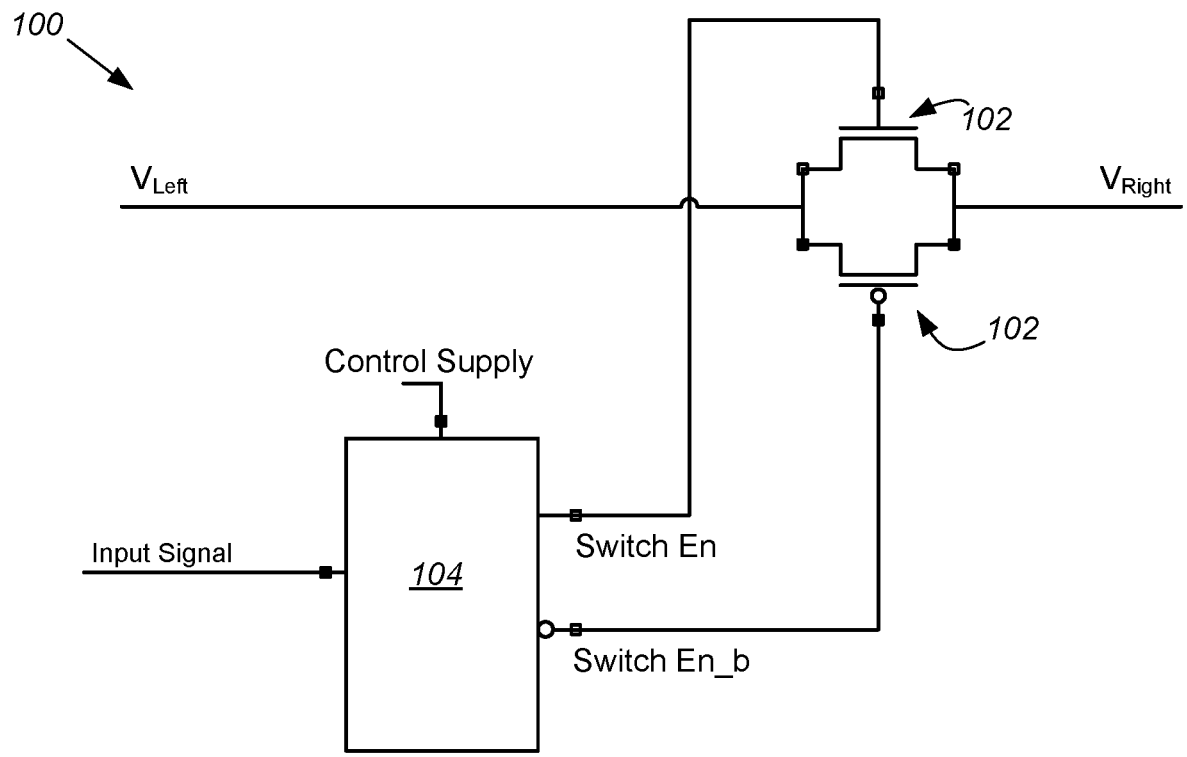
FIG. 1 (Conventional)
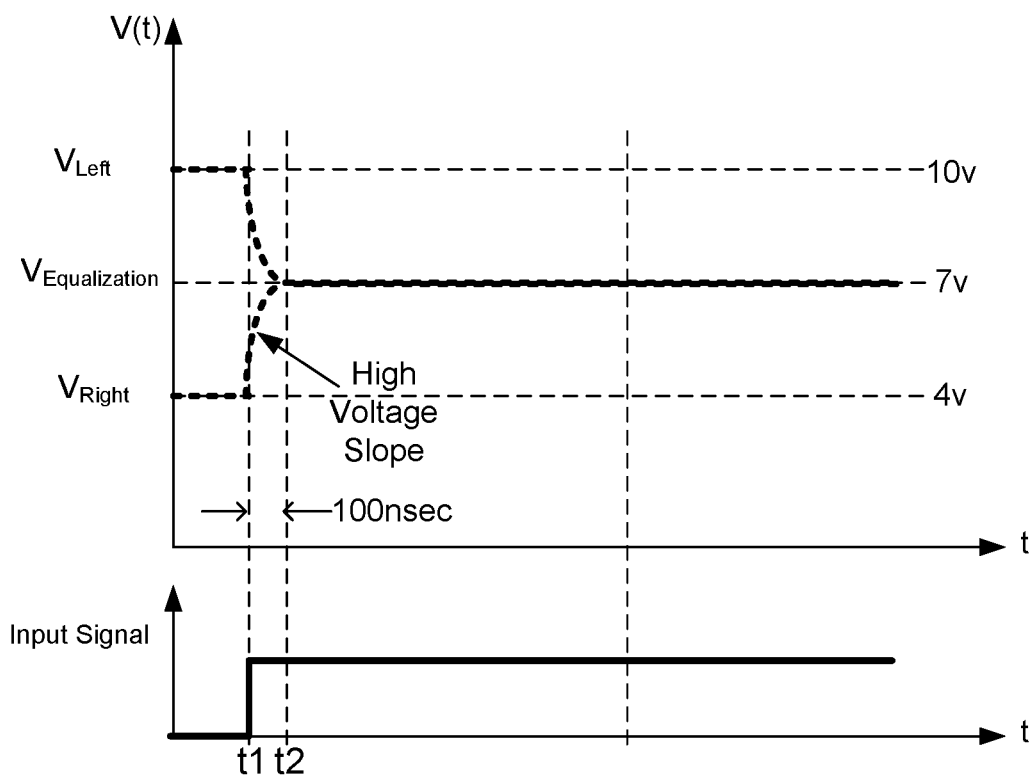
FIG. 2 (Conventional)

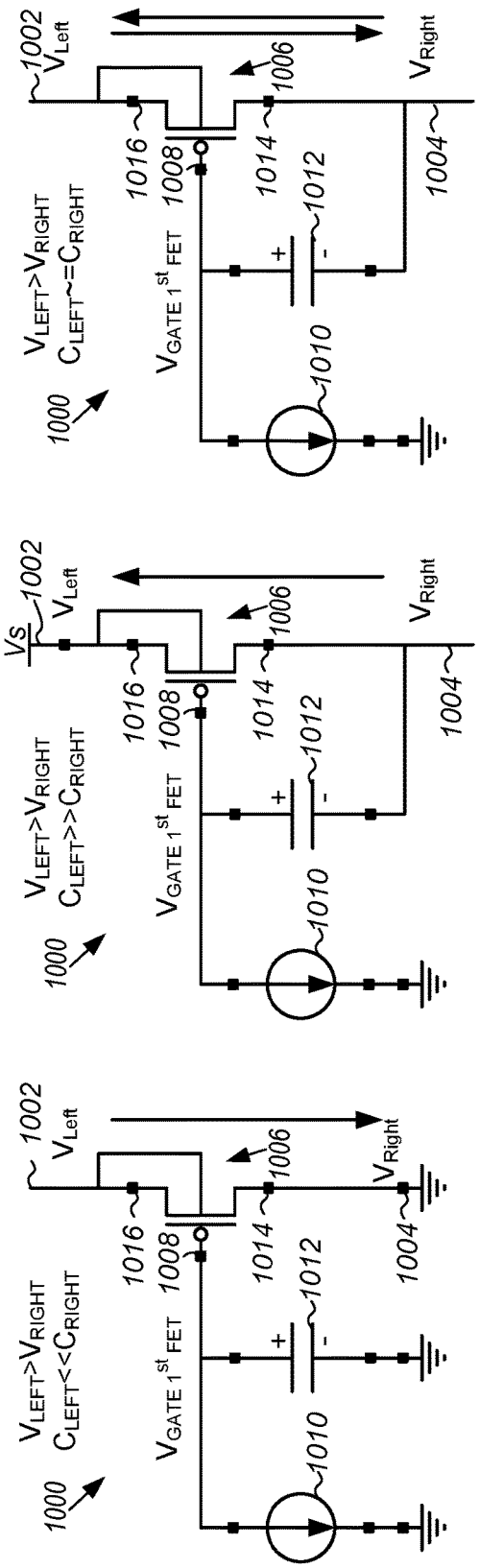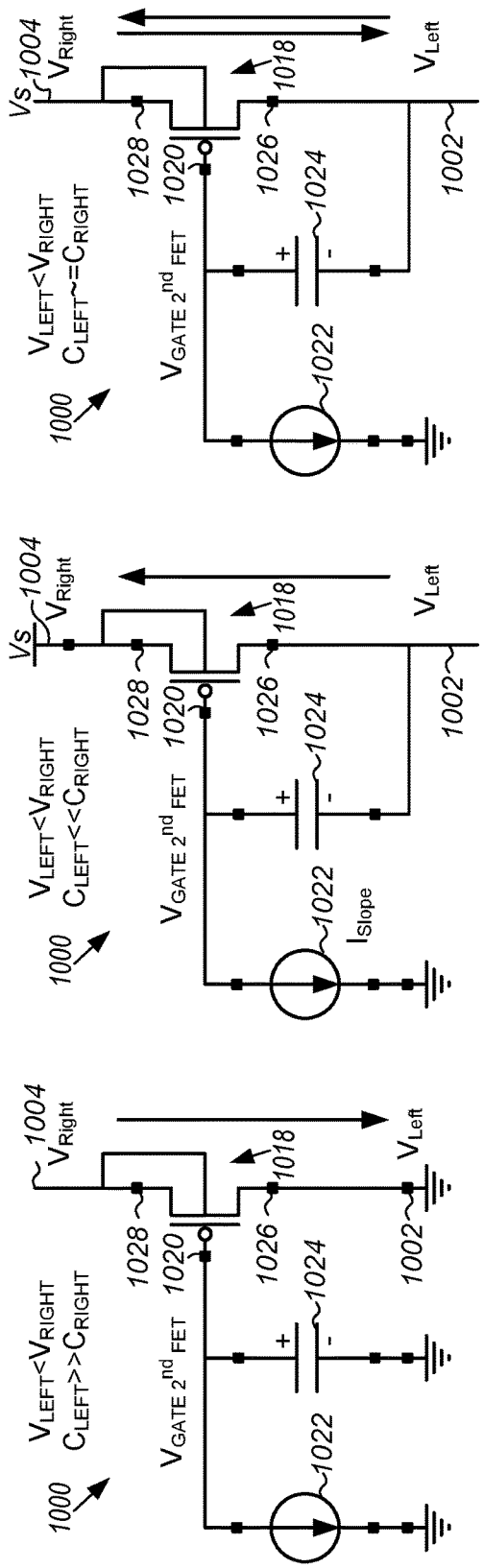

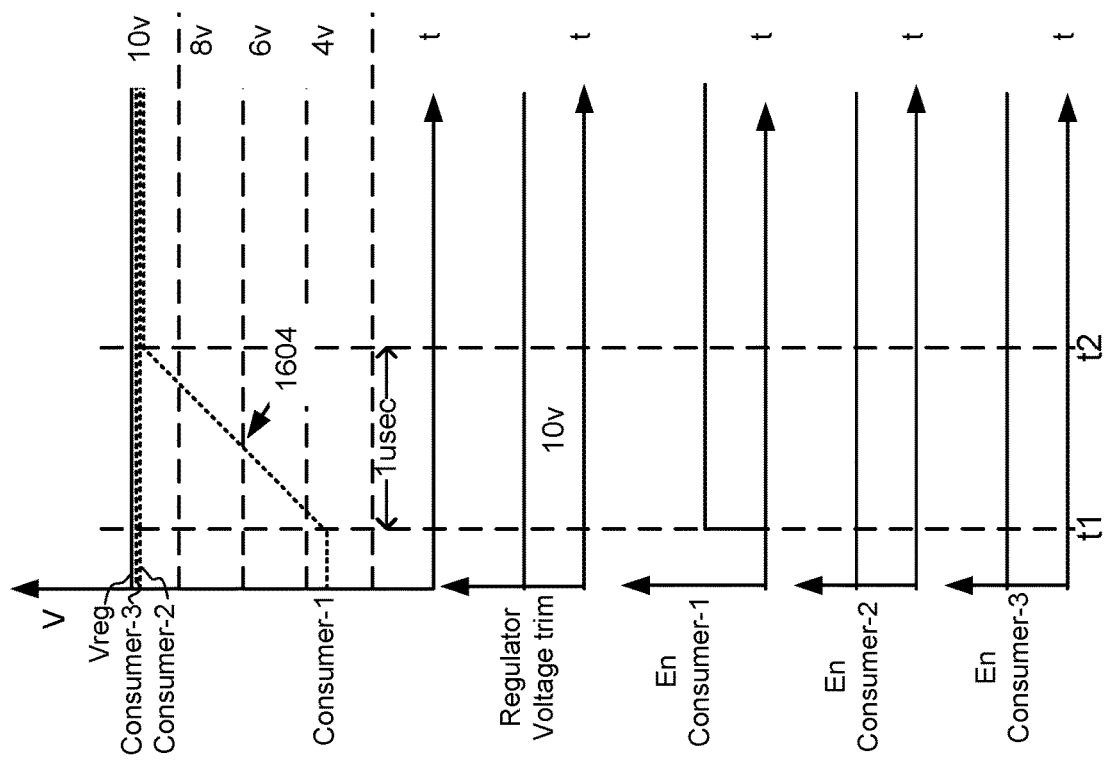
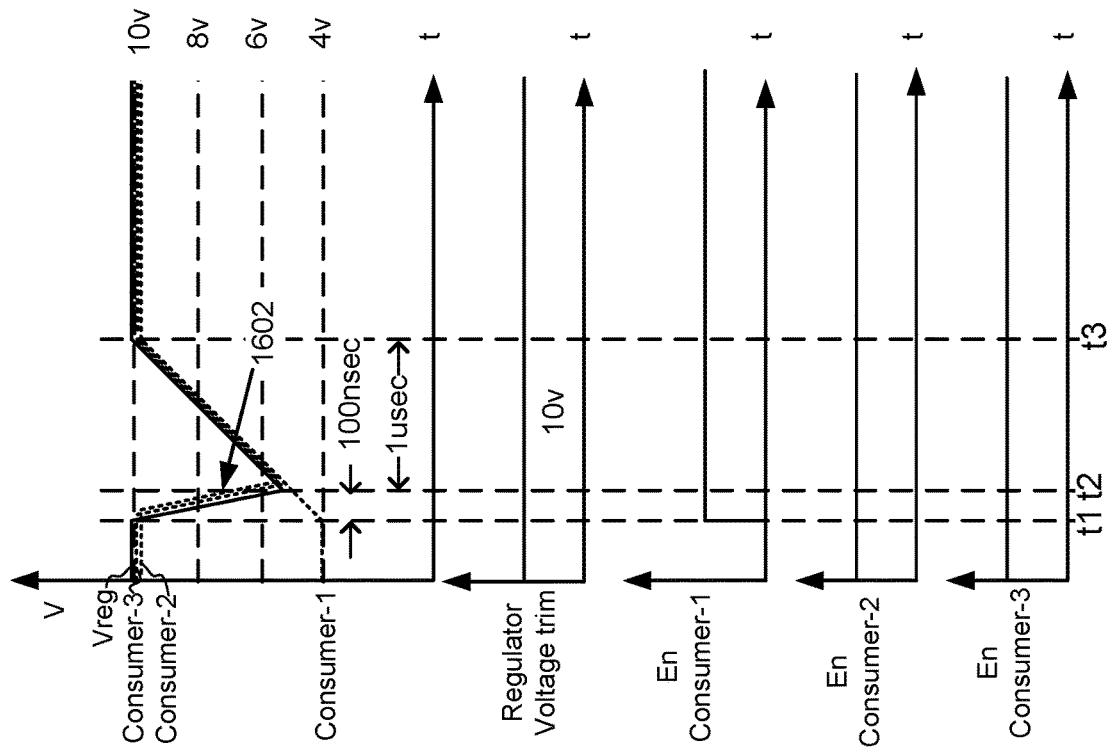
FIG. 16A (Conventional)
FIG. 16B

2002
COUPLING A REGULATOR VOLTAGE TO A MULTIPLEXER IN THE MULTI-CONSUMER VOLTAGE REGULATOR COMPRISING A PLURALITY OF DIFFERENTIAL-SLOPE LIMITING SWITCHES

2004
AT A FIRST TIME COUPLING A FIRST CONSUMER AT A FIRST VOLTAGE TO THE REGULATOR VOLTAGE THROUGH A FIRST DIFFERENTIAL-SLOPE LIMITING SWITCH OF THE PLURALITY OF DIFFERENTIAL-SLOPE LIMITING SWITCHES, AND LIMITING A SLOPE OF A VOLTAGE TRANSITIONS ACROSS THE FIRST DIFFERENTIAL-SLOPE LIMITING SWITCH

2006
AT A SECOND TIME COUPLING A SECOND CONSUMER AT A SECOND VOLTAGE TO THE REGULATOR VOLTAGE THROUGH A SECOND DIFFERENTIAL-SLOPE LIMITING SWITCH OF THE PLURALITY OF DIFFERENTIAL-SLOPE LIMITING SWITCHES, AND LIMITING A SLOPE OF A VOLTAGE TRANSITIONS ACROSS THE SECOND DIFFERENTIAL-SLOPE LIMITING SWITCH

2008
COUPLING WITH A LOWEST-VOLTAGE SELECTOR A NODE BETWEEN SOURCE/DRAINS OF FIRST AND SECOND TRANSISTORS TO A PORT OF THE SWITCH AT A LOWEST VOLTAGE, WHEREBY A FORWARD-BIAS CONDITION IS PREVENTED

*FIG. 20*

GENERAL-PURPOSE ANALOG SWITCH WITH A CONTROLLED DIFFERENTIAL EQUALIZATION VOLTAGE-SLOPE LIMIT

CROSS-REFERENCE TO RELATED APPLICATIONS

This application claims the benefit of priority under 35 U.S.C. 119(e) to U.S. Provisional Patent Application Ser. No. 62/821,880, filed Mar. 21, 2019, which is incorporated by reference herein in its entirety.

TECHNICAL FIELD

This disclosure relates generally to analog switches, and more particularly to differential slope-limited analog switches for use in a multi-consumer voltage regulator and methods of operating the same.

BACKGROUND

Analog switches are designed for and used in a wide range of applications to connect or disconnect signals on different sides of the switch, and/or equalize the voltage between the sides when, as is frequently the case, the signals are in different voltage domains. Referring to FIG. 1, a conventional analog switch 100 typically includes one or more voltage controlled semiconductor devices, such as a metal-oxide-semiconductor field-effect-transistor (FET 102), and a control circuit 104, configured to receive an input signal and generate one or more switch enable signals (switch_en) and complements (switch_en_B) to turn on or off the FET(s) 102 to connect or disconnect signals on different sides ($V_{Left}$ and $V_{Right}$) of the switch 100.

Referring to FIG. 2 it is noted that conventional analog switches typically cause high voltage-slope transitions when connecting two loads with significant voltage difference depending on a design and requirements of circuit in which the switch embodied. This in turn can result in very high, uncontrolled peak-currents, which can cause undesired noise and/or disturbance for other circuits in which the switch is included, as well as circuit malfunction or damage to circuits or elements on either or both sides of the switch, and are therefore undesirable. Generally, the voltage-slope is described or defined as a change in voltage divided by change in time (transition). Where the transition slope is not constant, for example where, as is often case, the change in voltage faster at a start of a transition and becomes slower towards the end of the transition, by voltage-slope it is meant the greatest magnitude of a change in voltage per unit of time achieved during in the voltage transition. In the embodiment illustrated graphically in FIG. 2 it is seen that the for a conventional analog switch connecting a 10 volt (v) signal on a first, $V_{Left}$ side of the switch 100, to a 4 v signal on a second, $V_{Right}$, of the switch following application of an ON/OFF input signal, results in high voltage-slope on both the left and right sides of the switch. In particular, it is noted that closing the analog switch results in high voltage-slope from a $V_{Left}$ of 10 v down to an equalization voltage ($V_{equalization}$) of 7 v, and from a $V_{Right}$ of 4 v up to the equalization voltage in less than about 100 nanoseconds (nsec).

In many applications, the voltage change across a closed analog switch must not yield such high voltage-slope transitions. This is especially the case in high-voltage applications, such as for analog switches used in voltage regulators to couple power or a reference voltage to consumers, such as capacitive-sensors, semiconductor memories, microcontrollers, interfaces and other electrical circuits or elements. Using a conventional, analog switch to connect or disconnect a consumer to a voltage source through the voltage regulator often leads to a rapid and uncontrolled change in voltage over time (dv/dt) resulting in a high voltage-slope transition across the switch, and undesirably high peak currents and/or under voltage conditions. Moreover, if not limited, this voltage slope may cause a voltage source output and/or the voltage source supply an undesired temporary voltage drop.

Another problem with conventional analog switches arises in applications in which multiple conventional analog switches are used in an attempt to supply multiple consumers in a system or device from a single, regulated voltage source. When a capacitive load of one of multiple consumers is substantially larger than that of the other consumers and/or an output capacitance of the voltage source, couple the consumer with the larger capacitive load to the voltage source through a conventional analog switch, will result in uncontrolled high voltage-slope transitions on the voltage source and on voltages supplied to the other consumers.

Accordingly, there is a need for an analog switch that is capable of limiting a voltage-slope of voltage transitions across the closed switch for a wide range of voltage differences. There is a further need for a voltage regulator and circuit including a multiple such switches to supply power and/or a reference voltage to multiple circuits and elements from a single voltage regulator.

SUMMARY

A general-purpose slope limiting analog switch and method for operating the same are provided to limit the slope of a voltage transition across a closed switch. The slope limiting analog switches are particularly useful in a multiplexer of a multiple or multi-consumer voltage regulator.

The differential-slope limiting switch is configured to provide a seamless bi-directional self-aligned differential-voltage transition slope-limit across a closed switch for a wide range of input voltage-differences, capacitive-load and operating conditions. Generally, the slope limiting analog switch includes a first transistor having a first source-drain (SD) and a well coupled to a first port of the switch, a gate, and a second SD, and a second transistor having a first SD and a well coupled to a second port, a gate, and a second SD coupled to the second SD of the first transistor. A first selector-circuit couples the gate of the first transistor to a first current-source when a signal to close the switch is received, and to a voltage on the first port when it is not received. A second selector-circuit couples the gate of the second transistor to a second current-source when the signal is received, or to a voltage on the second port. The switch further includes first and second capacitive elements coupled to gates of the first and second transistors. These capacitive elements, which can include discrete feedback/integration capacitors or an intrinsic capacitance produced between the gate and a SD of the transistors, and are sized and/or configured along with the current-sources to limit a slope of a voltage transition across the closed switch In some embodiments, the differential-slope limiting switch further includes a lowest-voltage-selector coupled between the first and second ports, and to a node ($V_{Mid}$) between the second SD of the first transistor and the second SD of the second transistor configured to couple the node to a lowest voltage on the first or second port to prevent forward-biasing of the first or second transistor coupled to the first or second port at the lowest voltage. In one exemplary embodiment the lowest-voltage-selector includes a third transistor and a fourth transistor coupled in series with one another, and in parallel with the first transistor and the second transistor. The third transistor has a first SD coupled to a first SD of the fourth transistor and to the node between the first and second transistors, a second SD coupled to the first port of the switch, and a gate coupled to the second port of the switch. The fourth transistor has a second SD coupled to the second port of the switch, and a gate coupled to the first port of the switch.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIG. 1 (conventional) is a schematic block diagram of a conventional analog switch;

FIG. 2 (conventional) is a wave diagram graphically illustrating an uncontrolled high-slope transition across the closed switch of FIG. 1;

FIG. 5 is a wave diagram graphically illustrating a controlled slope transition across the closed differential-slope limiting switch of FIG. 4 where capacitive loads on both sides are similar;

FIGS. 10A through 10F are simplified electrical schematic diagrams for a closed differential-slope limiting switch in transition for various voltages and capacitance loads;

FIGS. 16A and 16B are wave diagrams comparing the effect on a multi-consumer voltage regulator of adding a new high-capacitive consumer where a capacitive load of the new consumer is substantially greater than that of the regulator and other consumers for a voltage regulator using conventional analog switches versus a voltage regulator using differential-slope limiting switches;

FIG. 20 is a flowchart of a method for operating a multi-consumer voltage regulator having a multiplexer including differential-slope limiting switches.

DETAILED DESCRIPTION

A general purpose differential-slope limiting switch and methods for operating the same to limit slope across a closed switch for a wide range of input voltage-differences and wide range of capacitive load ratios across the switch are provided. The switch and methods of the present disclosure are particularly useful in or with multiple or multi-consumer voltage regulator, as well as any application that requires limiting charge sharing of between circuits connected by such a switch.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term to couple as used herein may include both to directly electrically connect two or more components or elements and to indirectly connect through one or more intervening components.

Figure 3:
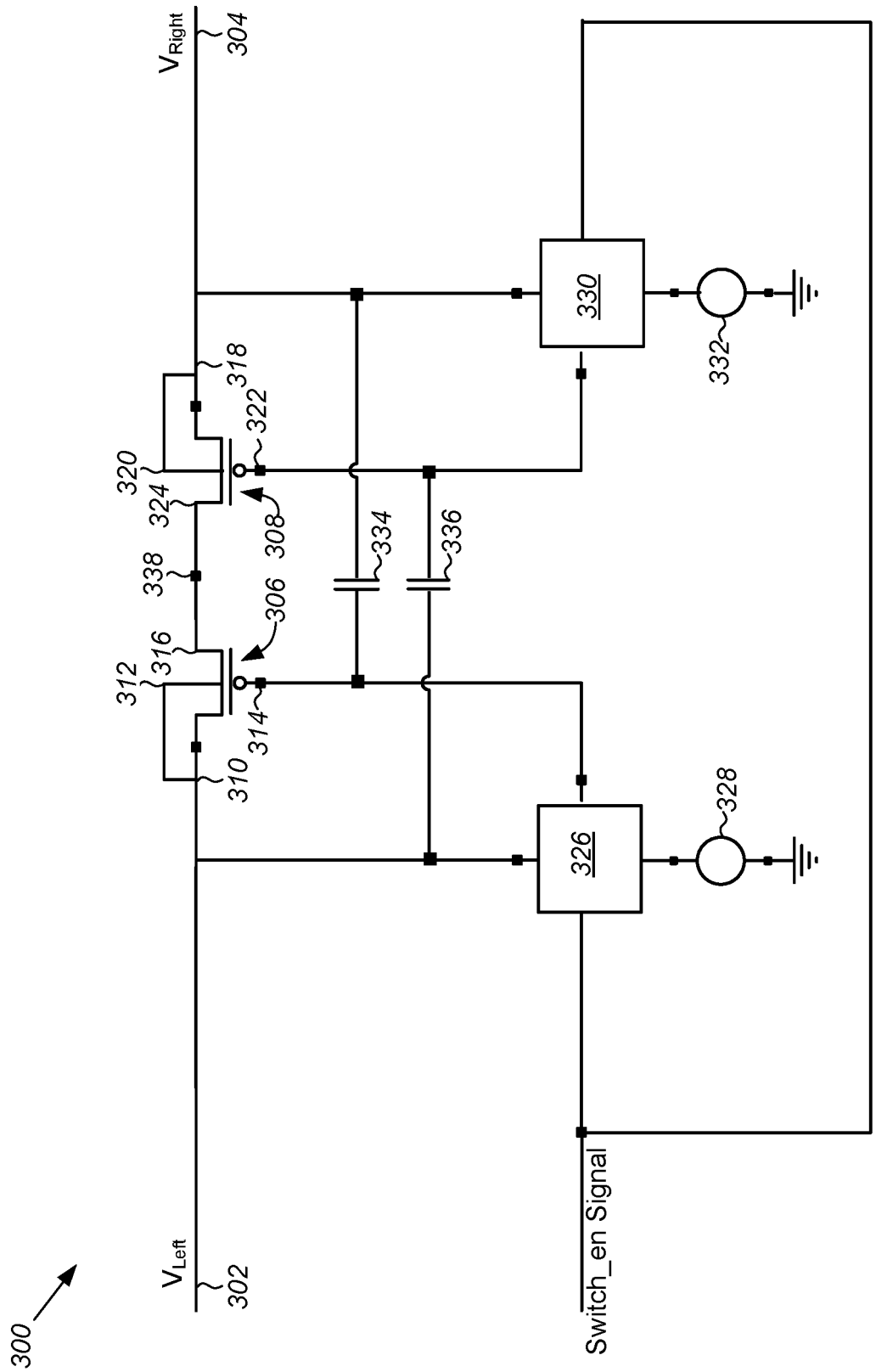
FIG. 3 is a block diagram of an embodiment of a differential-slope limiting switch.

FIG. 3 is a block diagram of an embodiment of a differential-slope limiting switch 300 incorporating a dual side symmetrical ramp-control mechanism or circuit configured to provide a seamless, bi-directional, self-aligned differential-voltage transition slope-limit across the closed switch for a wide range of input voltage-differences, capacitive-loads and operating conditions. By seamless it is meant that when the switch 300 is closed, voltages ($V_{Left}$, $V_{Right}$) on opposite sides or ports 302, 304 of the switch 300 transition towards each other with a constant differential slope until equalization is achieved without the need for outside control of the switch or switch components. Once the transition ends the switch 300 operates similarly to a standard analog switch.

Referring to FIG. 3, the differential-slope limiting switch 300 includes a first switching element 306 and a second switching element 308 coupled in series between the first and second ports 302, 304 of the switch. The switching elements are generally similarly sized, having similar or substantially equal threshold voltages (VTH), can generally include any suitable type of transistor. In the embodiment shown of FIG. 3 the first and second switching elements are shown and hereinafter described as field effect transistors (FETs). The first FET 306 includes a first source-drain (SD) region or terminal 310 and a well or body terminal 312 coupled to the first port 302 of the switch 300, a gate 314, and a second SD terminal 316. Similarly the second FET 308 includes a first SD terminal 318 and a body terminal 320 coupled to the second port 304 of the switch 300, a gate 322, and a second SD terminal 324 coupled to the second SD terminal 316 of the first FET.

The switch further includes a first selector-circuit 326 coupled to the gate 314 of the first FET 306, to a fixed voltage or high voltage (HV), such as the voltage ($V_{Left}$) received on the first port 302 in the embodiment shown, and to a first current-source 328. The first selector-circuit 326 is configured to selectively couple the gate 314 of the first FET 306 to the first current-source 328 when a switch-enable (switch_en) signal to close the switch 300 is received by the first selector-circuit, and to the fixed voltage or HV, such as $V_{Left}$ when the switch_en signal is not received to open the switch. A second selector-circuit 330 coupled to the gate 322 of the second FET 308, to a fixed voltage or HV, such as $V_{Right}$ received on the second port 304, and to a second current-source 332. The second selector-circuit 330 is configured to couple the gate 322 of the second FET 308 to the second current-source 332 when the switch_en signal is received by the second selector-circuit to close the switch 300 and to the fixed voltage or HV, such as $V_{Right}$, when the switch_en signal is not received to open the switch. The first and second selector-circuits 326, 330, can include any suitable circuit or sub-circuit capable of receiving the switch_en signal and selectively coupling either the first and second current-sources 328, 332, or a HV ($V_{Left}$ or $V_{Right}$) to the respective gates 314, 322 of the first or second FETs 306, 308. Optionally, where an input signal to operate the switch 300 is at a lower voltage than that necessary to serve as a switch_en signal, that is lower than either $V_{Left}$ or $V_{Right}$, the switch may further include a control circuit or level shifter (not shown in this figure) to shift the low voltage (LV) input signal to a HV domain desired for the switch_en signal.

The switch 300 further includes a first feedback capacitive element or capacitor 334 coupled to the gate 314 of the first FET 306, and a second feedback capacitive element 336 coupled to the gate 322 of the second FET 308. As with the first and second FETs 306, 308, the first and second capacitors 334, 336, are generally similarly sized, and have substantially equal capacitances. Although the first and second capacitors 334, 336, are shown as being coupled between the gates 314, 322, and the respective the first and second ports 302, 304, it is noted that this need not be the case in every embodiment. In some alternative embodiments, the first and second capacitors 334, 336, are coupled between the gates 314, 322, and a node 338 between the second SD terminals 316, 324 of the first and second FETs 306, 308. It is further noted that the first and second capacitors 334, 336 need not include discreet, physical elements, such as metal capacitors, but rather can be formed from an intrinsic capacitance ($C_{GD}$) formed between the gates and drains ($C_{GD}$) of substantially equally sized first and second FETs 306, 308.

Figure 4:
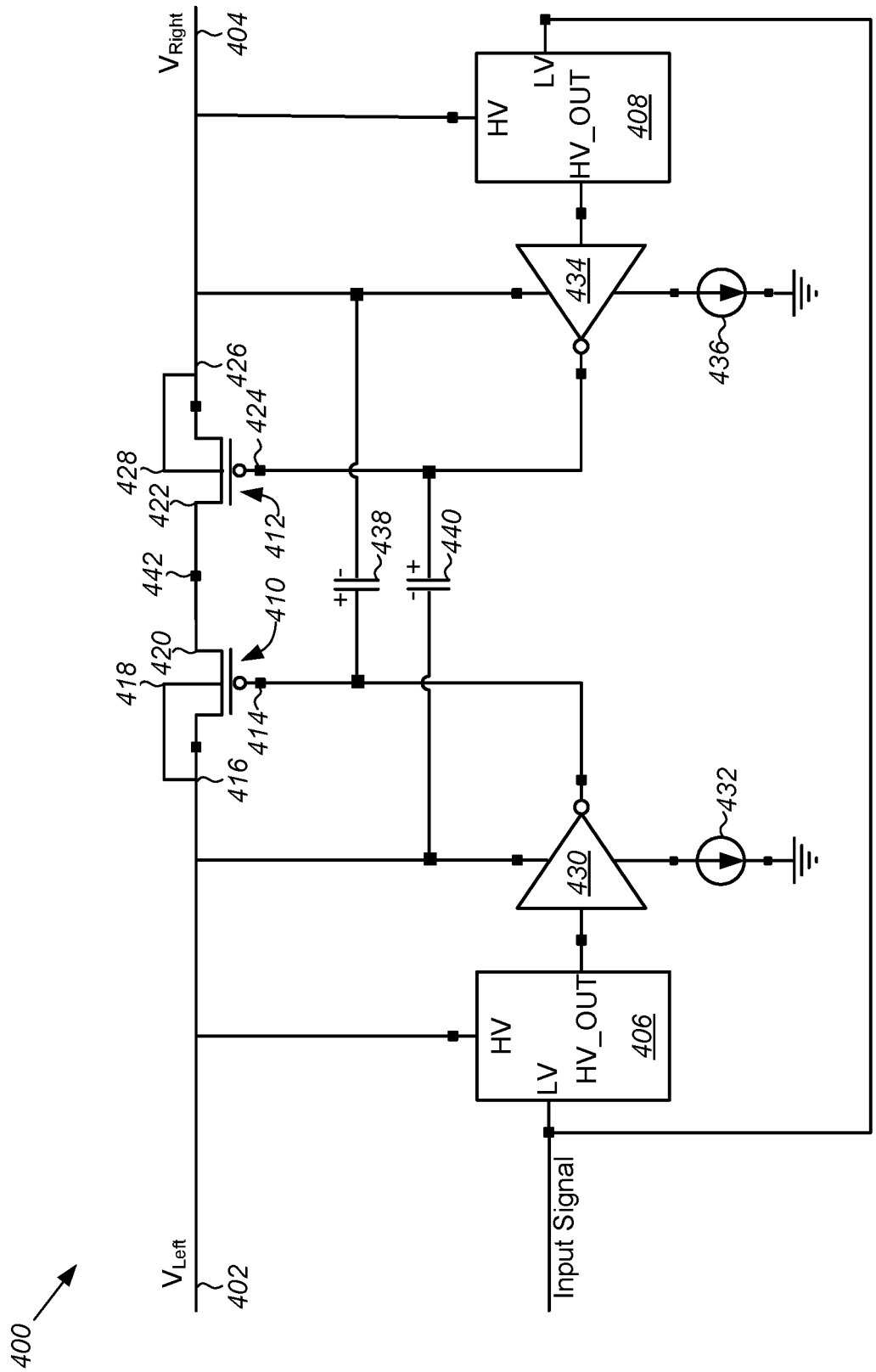
FIG. 4 is a detailed schematic block diagram of an embodiment of a differential-slope limiting switch.

FIG. 4 is a schematic block diagram of an embodiment of a differential-slope limiting switch 400 shown in greater detail. Generally, the differential-slope limiting switch 400 incorporates a dual side symmetrical ramp-control mechanism or circuit configured to provide a seamless, bi-directional, self-aligned differential-voltage transition slope-limit across the closed switch 400 for a wide range of input voltage-differences, capacitive-loads and operating conditions. By seamless it is meant that when the switch 400 is closed voltages ($V_{Left}$, $V_{Right}$) on opposite sides or ports 402, 404 of the switch 400 transition towards each other with a constant differential slope until equalization is achieved without the need for outside control of the switch or switch components. Once the transition ends the switch 400 operates similarly to a standard analog switch.

Referring to FIG. 4 the differential-slope limiting switch 400 includes a first level-shifter 406 and a second level-shifter 408 configured to receive a low voltage (LV) input signal and to shift or generate a high voltage (HV) switch enable signal (HV_OUT) to operate the switch. The switch 400 further includes a first switching element or transistor 410, and a second switching element or transistor 412 coupled in series between the first and second ports 402, 404. In the embodiment shown, the first and second transistors are field effect transistors (FET 410, 412). The first FET 410 has a gate 414 coupled to the first level-shifter 406, a first source-drain (SD) terminal or first SD 416 and a well or body terminal 418 coupled to the first port 402, and a second SD 420 coupled to a second SD 422 of the second FET 412. The second FET 412 also has a gate 424 coupled to the second level-shifter 408, and a first SD 426 and a body terminal 428 coupled to the second port 404.

It is noted that in FIG. 4 the first and second FETs 410 412, are shown as p-channel metal-oxide-semiconductor field-effect-transistors (PMOS) transistors. However, it will be understood that the differential-slope limiting switch 400 can also be implemented using n-channel MOSFETs (NMOS) with an appropriate selection of bias and voltages without departing from the breadth and scope of the present invention. Among other differences, using NMOS will typically require the current-sources to push current from a voltage source, which is higher than $V_{Left}/V_{Right}$ supplied to the first and second ports 402 and 404 respectively, rather than pull current to from a connection to ground. It is further noted that whether the SD terminals or regions of the first and second FETs 410 412, are sources or drains depends on a voltage conditions on the FETs, and while a particular SD terminal may operate as a drain under certain voltage conditions, it can also act as a source of the FET under other voltage conditions.

Generally, as in the embodiment of FIG. 3 described above, the differential-slope limiting switch 400 further incorporates a dual side symmetrical ramp-control mechanism configured to provide a seamless, bi-directional, self-aligned differential-voltage transition slope-limit across the closed switch 400 for a wide range of input voltage-differences, capacitive-loads and operating conditions. By seamless it is meant that when the switch 400 is closed voltages ($V_{Left}$, $V_{Right}$) on opposite ports 402, 404 of the switch 400 transition towards each other with a constant differential slope until equalization is achieved without the need for outside control of the switch or switch components. Once the transition ends the switch 400 operates similarly to a standard analog switch.

The switch 400 further includes a first selector-circuit, shown here as first inverter 430, coupled to the gate 414 of the first FET 410, to a fixed voltage or high voltage (HV), such as the voltage ($V_{Left}$) received on the first port 402 in the embodiment shown, and to a first current-source 432. The first inverter 430 is configured to selectively couple the gate 414 of the first FET 410 to the first current-source 432 when an input signal is supplied to close the switch 400, and a switch enable (HV_OUT) signal is received by the first inverter. The first inverter 430 is further configured to selectively couple the fixed voltage or HV, such as $V_{Left}$ to the gate 414 of the first FET 410 when the switch_en signal is not received to open the switch. A second inverter 434 is coupled to the gate 424 of the second FET 412, to a fixed voltage or HV, such as $V_{Right}$ received on the second port 404, and to a second current-source 436. The second inverter 434 is configured similarly to the first inverter 430 to couple the gate 424 of the second FET 412 to the second current-source 436 when the input signal is applied to close the switch 400, and to $V_{Right}$ when the input signal is not received to open the switch.

The switch 400 further includes a first feedback/integration capacitance element, such as a capacitor 438, coupled between the gate 414 of the first FET 410 and the second port 404, and a second feedback/integration capacitor 440 coupled between the gate 424 of the second FET 412 and the first port 402 of the switch 400. The first and second feedback capacitors 438, 440, are symmetrical or substantially equally sized. As described in greater detail below, the first and second capacitors 438, 440, need not include discreet, physical elements, such as metal capacitors, but rather can be formed from an intrinsic capacitance ($C_{GD}$) formed between the gates and drains ($C_{GD}$) of substantially equally sized first and second FETs 410, 412.

Generally, the biasing of first and second FETs 410, 412, is selected to protect current-sources 432, 434, from snapback conditions to maintain a predictable current. By snapback conditions it is meant that a voltage drain-to-source ($V_{ds}$) of a CMOS device, such as FET 410 412, does not exceed an allowed maximum voltage which causes undesired effects in a circuit in which it is embodied. For example, in one embodiment of a differential-slope limiting switch 400 the snapback voltage would be defined as about 6 v.

Figure 5:
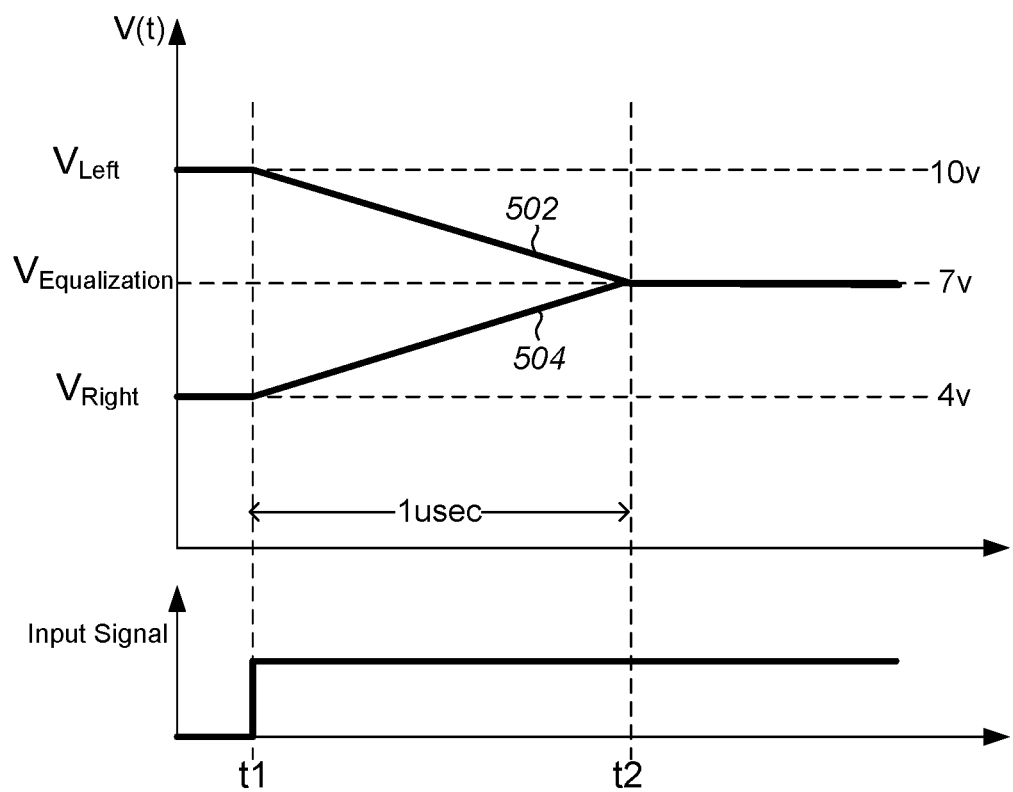

FIG. 5 is a wave diagram graphically illustrating controlled slope transitions across a closed differential-slope limiting switch 400 for first and second ports 402, 404, of the switch, where both ports have substantially equal capacitive loads, and a voltage difference between $V_{Left}$ and $V_{Right}$ is about 6 volts. Referring to FIGS. 4 and 5, where the switch 400 is initially opened, when the switch 400 is closed, that is when the input signal is first applied to the level_shifters 406, 408, the first and second current sources 432, 436, are selectively coupled through the first and second inverters 430, 434, to the gates 414, 424 of the first and second FETs 410, 412, simultaneously discharging the gates of the FETs towards GND with a slope equal to $I_{CURRENT-SOURCE}/C_{FEEDBACK}$. The ramp or slope of a voltage transition across the switch 400 will start only when a gate to source bias ($V_{GS}$) for both gates 414, 424, is above a threshold voltage ($V_T$) for the first and second FETs 410, 412, ($|V_{GS}|>V_{TP}$). When reaching this state, shown in FIG. 5 as time t1, the ramp-control operation is dependent on which port 402, 404, of the switch 400 has a higher voltage. When, as in the example illustrated in FIG. 5, $V_{Left}>V_{Right}$ and $|V_{GS-1st\ FET}|>V_T$, the first FET 410 is biased such that it is self-aligned by the first current source 432 and the first capacitor 438 to enable the current through the first FET 410 to maintain differential-slope-limited transitions, shown as lines 502, 504, in FIG. 5, on both ports 402, 404, toward each other until an equalization voltage ($V_{Equalization}$) is reached. Under these conditions a gate 424 to first SD 426 bias $|V_{GS-2nd\ FET}| \approx |V_{GD-2nd\ FET}|$ of the second FET 412 continues increasing until a voltage on the gate 424 ($V_{GATE-2nd\ FET}$) is equal to ground (GND) ($|V_{GS-2nd\ FET}| \approx |V_{GD-2nd\ FET}| = V_{Right}$), where during its transition to GND the resistance of the second FET relative to the first FET 410 is considered to be low. For this reason, a voltage ($V_{Mid}$) at a node 442 between the first and second SD 420, 422, of the FETs 410, 412, will be close to $V_{Right}$, preventing forward-bias of the second FET 412. A differential slope of the switch 400 is equal to the sum of the absolute slopes 502, 504, on both sides or ports 402, 404, which are proportional to the other side capacitance ratio to the total capacitance of both sides. So the voltage-slope of each side transition can be estimated or calculated as follows:

$$\text{Slope}(V_{LEFT}) = \left[\frac{I_{CURRENT\_SOURCE}}{C_{FEEDBACK}}\right] \times \frac{C_{LOAD\_RIGHT}}{[C_{LOADLEFT} + C_{LOAD\_RIGHT}]} \quad \text{(Eq. 1)}$$

$$\text{Slope}(V_{RIGHT}) = \left[\frac{I_{CURRENT\_SOURCE}}{C_{FEEDBACK}}\right] \times \frac{C_{LOADLEFT}}{[C_{LOADLEFT} + C_{LOAD\_RIGHT}]} \quad \text{(Eq. 2)}$$

Thus, the differential slope can be estimated or calculated by:

$$\text{Slope}(V_{LEFT\_RIGHT\_DIFF}) = \qquad \text{(Eq. 3)}$$

$$\text{Slope}(V_{LEFT}) + \text{Slope}(V_{RIGHT}) = \frac{I_{CURRENT\_SOURCE}}{C_{FEEDBACK}}$$

Figure 6A:
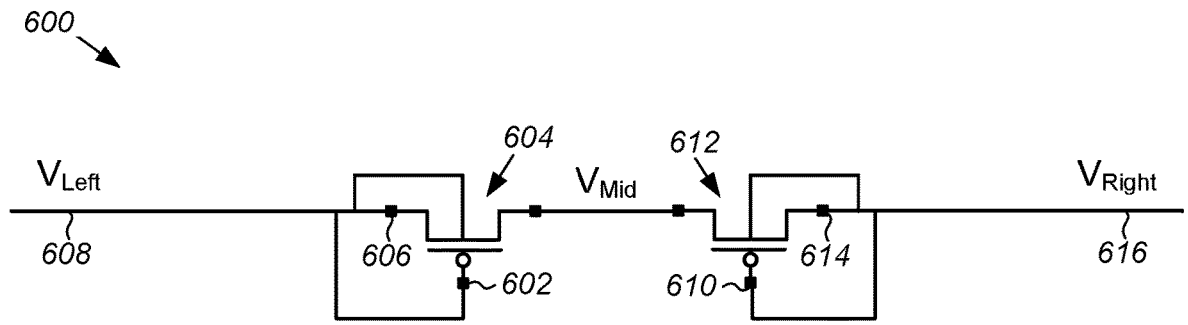
FIG. 6A is a schematic diagram of an equivalent switch for an opened differential-slope limiting switch in a steady state condition.
Figure 6B:
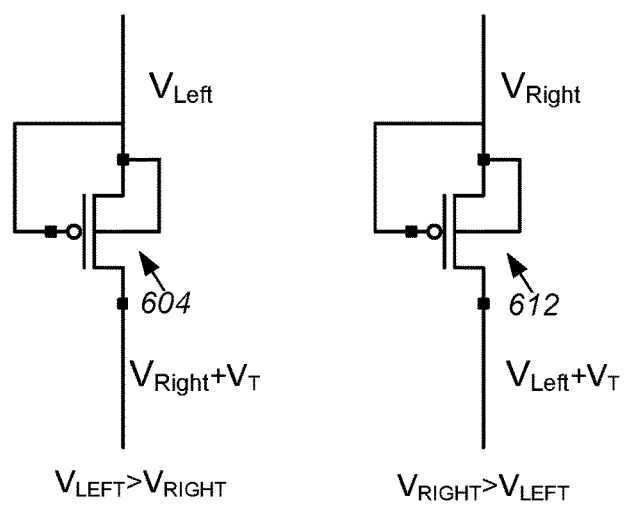
FIG. 6B are simplified electrical schematic diagrams for an opened differential-slope limiting switch in a steady state condition.

FIGS. 6A and 6B illustrate the opened steady state of a differential-slope limiting switch, such as shown in FIG. 4. FIG. 6A is a schematic diagram of an equivalent switch for an opened differential-slope limiting switch 600 in a steady condition. FIG. 6B are simplified electrical schematic diagrams for an opened differential-slope limiting switch in a steady condition on both ports of the switch. In particular, the left-hand-side schematic illustrates where $V_{Left}$ is greater than $V_{Right}$, and the right-hand-side schematic illustrates where $V_{Right}$ is greater than $V_{Left}$. Referring to FIG. 6A, a gate 602 of a first FET 604 in the switch 600 is shorted to its source 606 and coupled to a first port 608 of the switch. A gate 610 of a second FET 612 is shorted to its source 614 and coupled to a second port 616 of the switch 600. So the gate-source voltage ($V_{GS}$) of at least one of the first and the second FETs 604, 612, is equal to 0 v. In this state, both sides or ports 608, 616 of the switch 600 are disconnected from each other while a middle node $V_{Mid}$ is biased to the lower of $V_{Left}$ or $V_{Right}$ plus a threshold voltage ($V_T$) of the FET having the lower voltage or $V_{Mid} = \text{MIN}(V_{Right}, V_{Left}) + V_T$, as shown in the simplified electrical schematics of FIG. 6B.

Figure 7A:
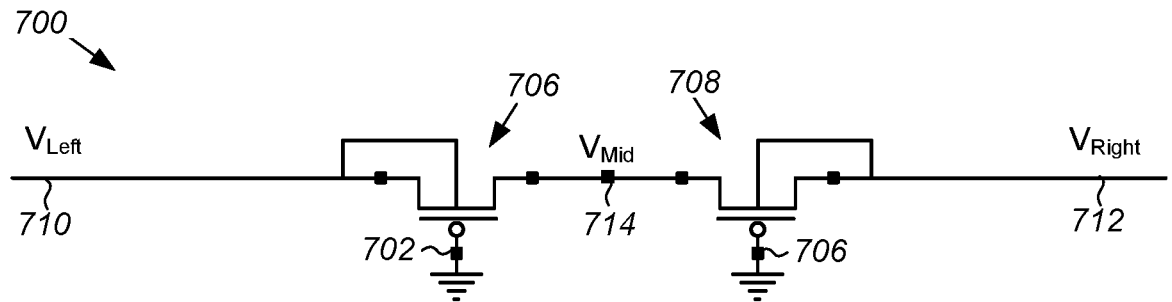
FIG. 7A is a schematic diagram of an equivalent switch for a closed differential-slope limiting switch in a steady state condition.
Figure 7B:
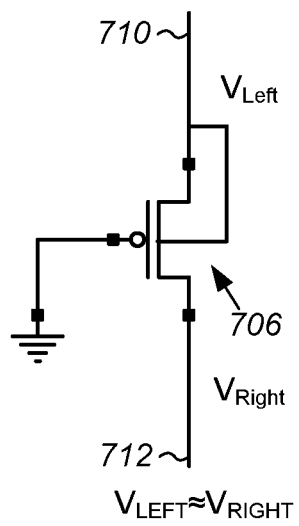
FIG. 7B is a simplified electrical schematic diagram for a closed differential-slope limiting switch in a steady state condition.

FIGS. 7A and 7B illustrate the closed steady state of a differential-slope limiting switch 700, such as shown in FIG. 4. FIG. 7A is a schematic diagram of an equivalent switch for differential-slope limiting switch 700 in a closed steady condition. FIG. 7B is a simplified electrical schematic diagrams for the differential-slope limiting switch in the closed steady condition in which voltages, $V_{Left}$ and $V_{Right}$, on both ports of the switch are substantially equal. Referring to FIG. 7A, both a gate 702 of a first FET 704 and a gate 706 of a second FET 708 are shorted to ground so that the gate-source voltage ($V_{GS}$) of both the first and the second FETs 704, 708, equal to one another and $V_{Left}$ and $V_{Right}$ In this state, both sides or ports 710, 712, of the switch 700 are connected with very low resistance while a voltage ($V_{Mid}$) on a middle node 714 is substantially equal to $V_{Left}$ and $V_{Right}$, resulting in the simplified electrical circuit shown schematically in FIG. 7B.

Figure 8A:
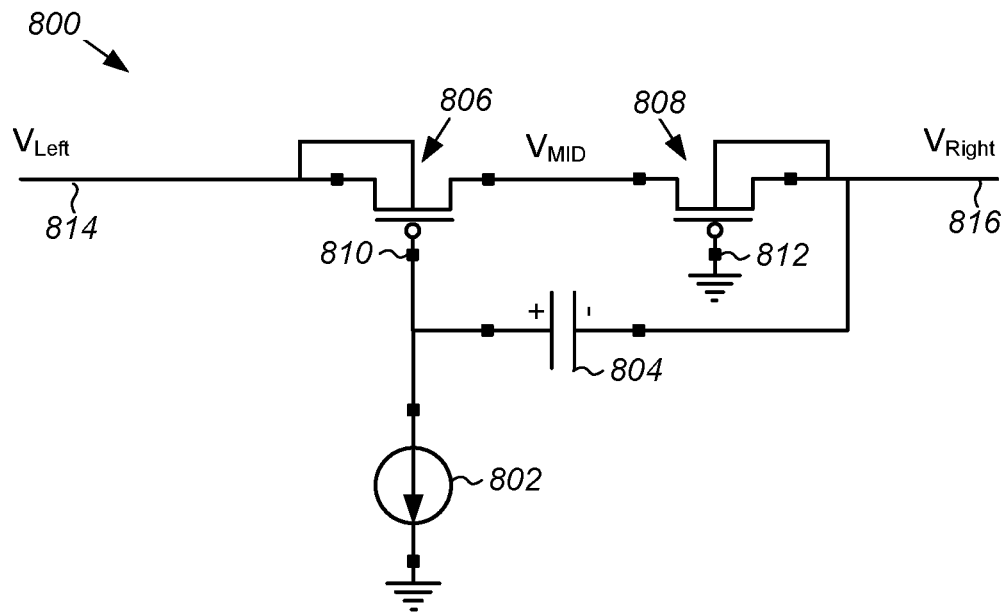
FIG. 8A is a schematic diagram of an equivalent switch for a closed differential-slope limiting switch in transition where $V_{Left}$ is greater than $V_{Right}$.
Figure 8B:
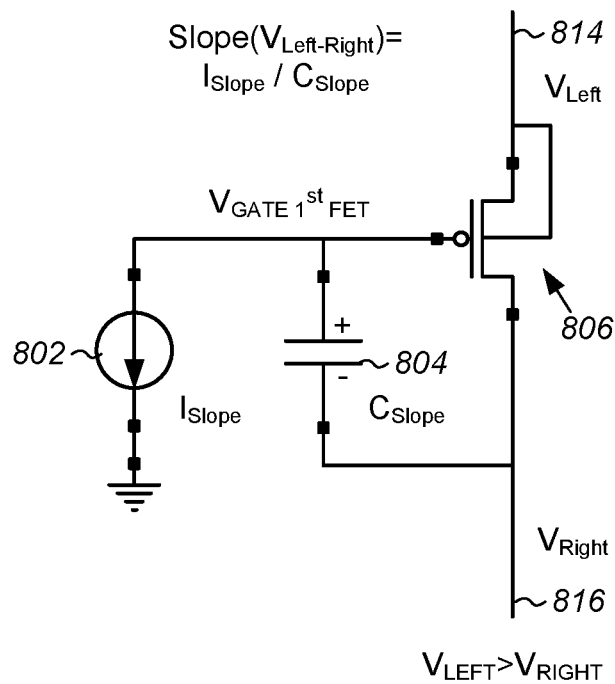
FIG. 8B is a simplified electrical schematic diagram for a closed differential-slope limiting switch in transition where $V_{Left}$ is greater than $V_{Right}$.

FIGS. 8A and 8B illustrate an equivalent switch scheme and simplified electrical schematic for a differential-slope limiting switch, such as shown in FIG. 4, in transition and will now be referred to explain operation principals of a dual-side-differential switch when $V_{Left} > V_{Right}$, from when it is closed and until it reaches a steady state, where $V_{Left} = V_{Right}$. Referring to FIGS. 8A and 8B, when the switch 800 is initially closed, gate ramp-control circuits (only one of which is shown, and which include a current-source 802, a feedback/integration capacitor 804 and both FETs 806, 808), for both the first FET 806 and a second FET 808 simultaneously discharge gates 810, 812, of the FETs towards GND with a slope equal to $I_{CURRENT\_SOURCE}/C_{FEEDBACK}$. The ramp or slope of a voltage transition across the switch 800 will start only when a gate to source bias ($V_{GS}$) for both gates 810, 812, is above a threshold voltage ($V_T$) for the first and second FETs 806, 808, ($|V_{GS}| > V_{TP}$). When reaching this state, the ramp-control operation depends on which side or port 814, 816, of the switch 800 has a higher voltage. When, as in the example illustrated in FIGS. 8A and 8B, $V_{Left} > V_{Right}$ and $|V_{GS-1st\ FET}| > V_T$, the first FET 806 is biased such that it is self-aligned by the ramp-control (current-source 802 and capacitor 804) to enable the current through the first FET 806 to maintain a differential-slope-limited transition on both sides or ports 814, 816, toward each other. Under these conditions a gate to source bias $|V_{GS-2nd\ FET}| \approx V_{GD-2nd\ FET}|$ of the second FET 808 continues increasing until $V_{GATE-2nd\ FET} = \text{GND}$ ($|V_{GS-2nd\ FET}| \approx |V_{GD-2nd\ FET}| = V_{Right}$). At this steady state where VGATE-2nd FET=GND and during its transition to GND, a resistance of the second FET relative to the first FET 806 is considered to be low. For this reason, the $V_{Mid}$ will be close to $V_{Right}$, preventing forward-biasing of the second FET 808. A differential slope of the switch 800 (which is the sum of the absolute slopes on both sides or ports 814, 816 of the switch) is equal to $I_{CURRENT\-SOURCE}/C_{FEEDBACK}$, where each side's slope is proportional to the other side capacitance ratio to the total capacitance of both sides, neglecting the gate to drain capacitance ($C_{GD}$) of the FETs, which if significant is added to $C_{FEEDBACK}$. So the voltage-slope of each side transition can be estimated as follows:

$$\text{Slope}(V_{LEFT}) = \left[\frac{I_{CURRENT\_SOURCE}}{C_{FEEDBACK}}\right] \times \frac{C_{LOAD\_RIGHT}}{[C_{LOADLEFT} + C_{LOAD\_RIGHT}]} \qquad \text{(Eq. 1)}$$

$$\text{Slope}(V_{RIGHT}) = \qquad \text{(Eq. 2)}$$

$$\left[\frac{I_{CURRENT\_SOURCE}}{C_{FEEDBACK}}\right] \times \frac{C_{LOADLEFT}}{[C_{LOADLEFT} + C_{LOAD\_RIGHT}]}$$

Thus, the differential slope can be estimated by:

$$\text{Slope}(V_{LEFT\_RIGHT\_DIFF}) = \qquad \text{(Eq. 3)}$$

$$\text{Slope}(V_{LEFT}) + \text{Slope}(V_{RIGHT}) = \frac{I_{CURRENT\_SOURCE}}{C_{FEEDBACK}}$$

After voltages on both sides or ports 814, 816 of the switch 800 are equal, the ramp-control no longer effects operation of the switch, and both gates 810, 812, continue discharging towards GND, which is the steady state condition of the closed switch, with a voltage-slope of $I_{CURRENT\_SOURCE}/C_{FEEDBACK}$. Normally, the gate of the FET near the lower voltage side, which is considered low resistance, will reach GND sooner than the gate of the FET which formed the self-aligned differential ramp control.

Figure 9A:
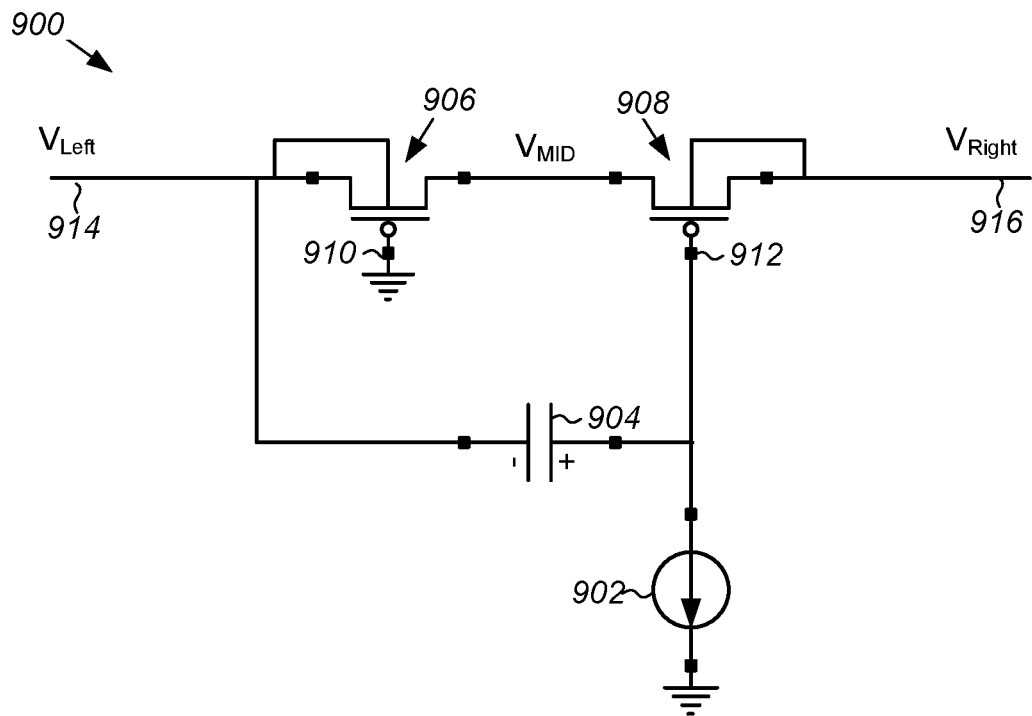
FIG. 9A is a schematic diagram of an equivalent switch for a closed differential-slope limiting switch in transition where $V_{Left}$ is less than $V_{Right}$.
Figure 9B:
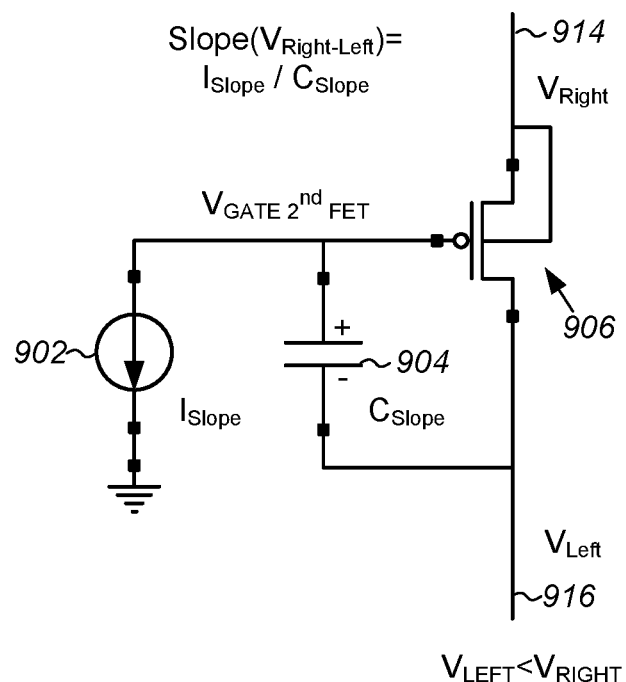
FIG. 9B is a simplified electrical schematic diagram for a closed differential-slope limiting switch in transition where $V_{Left}$ is less than $V_{Right}$.

FIGS. 9A and 9B illustrate an equivalent switch scheme and simplified electrical schematic for a portion of a differential-slope limiting switch, such as shown in FIG. 4, and will now be referred to explain operation principals of the switch when $V_{Left}$ is initially less than $V_{Right}$, and when it is closed until it reaches a steady state, where $V_{Left} = V_{Right}$. Referring to FIGS. 9A and 9B, when the switch 900 is initially closed, gate ramp-control circuits (only one of which is shown, and which include a current-source 902 a feedback/integration capacitor 904 and both FETs 906, 908), for both the first FET 906 and the second FET 908 FIGS. 9A and 9B illustrate an equivalent switch scheme and simplified electrical schematic for a portion of a differential-slope limiting switch, such as shown in FIG. 4, and will now be referred to explain operation principals of the switch when $V_{Left}$ is initially less than $V_{Right}$, and when it is closed until it reaches a steady state, where $V_{Left} = V_{Right}$. Referring to FIGS. 9A and 9B, when the switch 900 is initially closed, the gate ramp-control circuit (which include a current-source 902 a feedback/integration capacitor 904 and both the first FET 906 and a second FET 908 simultaneously discharge gates 910, 912, of the FETs towards GND with a slope equal to $I_{CURRENT-SOURCE}/C_{FEEDBACK}$. The ramp or slope of a voltage transition across the switch 900 will start only when a gate to source bias ($V_{GS}$) for both gates 910, 912, is above a threshold voltage ($V_T$) for the first and second FETs 906, 908, $-|V_{GS}|>V_{TP}$. When reaching this state, the ramp-control operation depends on which side or port 914, 916, of the switch 900 has a higher voltage. When, as in the example illustrated in FIGS. 9A and 9B, $V_{Left}<V_{Right}$ and $|V_{GS-2nd\ FET}|>V_T$, the second FET 908 is biased such that it is self-aligned by the ramp-control (current-source 902 and capacitor 904) to enable the current through the second FET 908 to maintain a differential-slope-limited transition on both sides or ports 914, 916, toward each other. Under these conditions a gate to source bias $|V_{GS-1st\ FET}|\approx V_{GD-1st\ FET}|$ Of the first FET 906 continues increasing until $V_{GATE-1st\ FET}=GND$ ($|V_{GS-1st\ FET}|\approx |V_{GD-1st\ FET}|=V_{Right}$). At this steady state, where VGATE-1st FET=GND and during its transition to GND a resistance of the first FET relative to the second FET 908 is considered to be low. For this reason, the $V_{Mid}$ will be close to $V_{Left}$, preventing forward-bias of the first FET 906. A differential slope of the switch 900 (which is the sum of the absolute slopes on both sides or ports 914, 916 of the switch) is equal to $I_{CURRENT-SOURCE}/C_{FEEDBACK}$, where each side's slope is proportional to the other side capacitance ratio to the total capacitance of both sides. Neglecting the gate to drain capacitance ($C_{GD}$) of the FETs, the voltage-slope of each side transition, and the differential slope of the switch 900 can be estimated using equations 1 through 3, given above.

FIGS. 10A through 10F are simplified electrical schematic diagrams for a portion of a closed differential-slope limiting switch 1000, such as that shown in FIG. 4, and will now be referred to explain principals of operation for a dual-side-differential symmetrical ramp-control mechanism of the switch in transition for various voltages and capacitance loads. The arrows adjacent to FIGS. 10A to 10D indicate a transition direction of a ramp-up or ramp-down for a switch operation described with respect to the figure. The arrows adjacent to FIGS. 10E to 10F indicate the switch 1000 operation results in simultaneous ramp-down/ramp-up of switch ports towards each other, as explained below.

Referring to FIG. 10A/10B, when one of the ports 1002, 1004, of the switch having a higher voltage ($V_{Left}$ or $V_{Right}$) also has a significantly lower load capacitance ($C_{Left}$ or $C_{Right}$), a FET adjacent to this port will act as a source-follower with a ramp-down controlled gate. Referring to FIG. 10A, in the embodiment shown the first port 1002 of the switch 1000 is at a higher voltage ($V_{Left}$) than that on the second port 1004 ($V_{Right}$) and has a significantly lower load capacitance ($C_{Left}$) than that on the second port ($C_{Right}$). Thus, a first FET 1006 in the switch 1000 is configured as a source-follower with a ramp-down controlled gate 1008 controlled by a first current source 1010 and a first feedback/integration capacitor 1012. A drain 1014 of the first FET 1006 is biased by a strong supply (illustrated as ground) and a source 1016 of the first FET self-aligns itself to the gate 1008 and as a result the higher voltage ($V_{Left}$) on the first port 1002 decreases with a constant slope which is determined by and equal to $I_{CURRENT-SOURCE}/C_{FEEDBACK}$. The slope of a voltage transition on the lower voltage port, i.e., the second port 1004, is substantially equal to zero.

Referring to FIG. 10B, when the first port 1002 of the switch 1000 is at a lower voltage ($V_{Left}$) than that on the second port 1004 ($V_{Right}$) and has a significantly higher load capacitance ($C_{Left}$) than that on the second port ($C_{Right}$), a second FET 1018 in the switch 1000 is configured as a source-follower with a ramp-down controlled gate 1020 controlled by a second current source 1022 and a second feedback/integration capacitor 1024. A drain 1026 of the second FET 1018 is biased by a strong supply (illustrated as ground) and a source 1028 of the second FET self-aligns itself to the gate 1020 and as a result the higher voltage ($V_{Right}$) on the second port 1004 decreases with a constant slope which is determined by and equal to $I_{CURRENT-SOURCE}/C_{FEEDBACK}$. The slope of a voltage transition on the lower voltage port, i.e., the first port 1002 remains substantially equal to zero.

Referring to FIG. 10C/10D, when one of the ports 1002, 1004, of the switch having a higher voltage ($V_{Left}$ or $V_{Right}$) also has a significantly higher load capacitance ($C_{Left}$ or $C_{Right}$), a FET adjacent to this port will act as a miller-stage in which the gate bias is self-aligned to maintain the desired voltage-slope on the FET drain. Referring to FIG. 10C, in the embodiment shown the first port 1002 of the switch 1000 is at a higher voltage ($V_{Left}$) and also has a significantly higher load capacitance ($C_{Left}$) than that on the second port 1004 ($C_{Right}$). Thus, the first FET 1006 is configured as a miller-stage that acts as a ramp-up control circuit in which gate 1008 is controlled by the first current source 1010 and the first capacitor 1012. A source 1016 of the first FET 1006 is biased by a strong supply (illustrated as a supply) and the drain 1014 of the first FET 1006 is rising with a constant slope which is determined by and equal to $I_{CURRENT-SOURCE}/C_{FEEDBACK}$. The slope of a voltage transition on the higher voltage port, i.e., the first port 1002, is substantially equal to zero.

FIG. 10D, illustrates the case where the voltage on the first port 1002 ($V_{Left}$) is lower than that on the second port 1004 ($V_{Right}$), and where the first port 1002 of the switch 1000 has a significantly lower load capacitance ($C_{Left}$) than that on the second port ($C_{Right}$). Referring to FIG. 10D, second FET 1018 acts as a miller-stage based ramp-up control circuit in which gate 1020 is controlled by the first current source 1022 and the first capacitor 1024. A source 1028 of the second FET 1018 is biased by a strong supply (illustrated as supply Vs) and the drain 1026 of the second FET 1018 is rising with a constant slope which is determined by and equal to $I_{CURRENT-SOURCE}/C_{FEEDBACK}$. The slope of a voltage transition on the higher voltage port, i.e., the second port 1004, is substantially equal to zero.

Referring to FIG. 10E/10F, when one of the ports 1002, 1004, of the switch has a higher voltage ($V_{Left}$ or $V_{Right}$), but the load capacitance ($C_{Left}$ and $C_{Right}$) substantially equal or of the same order of magnitude, a FET adjacent to this port will act as both a source-follower and as a miller-stage. Referring to FIG. 10E, in the embodiment shown the first port 1002 of the switch 1000 is at a higher voltage ($V_{Left}$) and will ramp-down, and the lower voltage second port 1004 will ramp-up, each with a slope dependent on the other side capacitance ratio to the total capacitance of both sides. However, a differential voltage-slope between the first and second ports 1002, 1004, is independent of the load capacitance of each. This differential slope is the sum of the two switch ports' absolute slopes, where each side's slope is proportional to the other side capacitance ratio to the total capacitance of both sides. Neglecting the gate to drain capacitance ($C_{GD}$) of the FETs, the voltage-slope of each side transition, and the differential slope of the switch 900 can be estimated using equations 1 through 3, given above.

FIG. 10F, illustrates the case where the voltage on the first port 1002 ($V_{Left}$) is lower than that on the second port 1004

Figure 11:
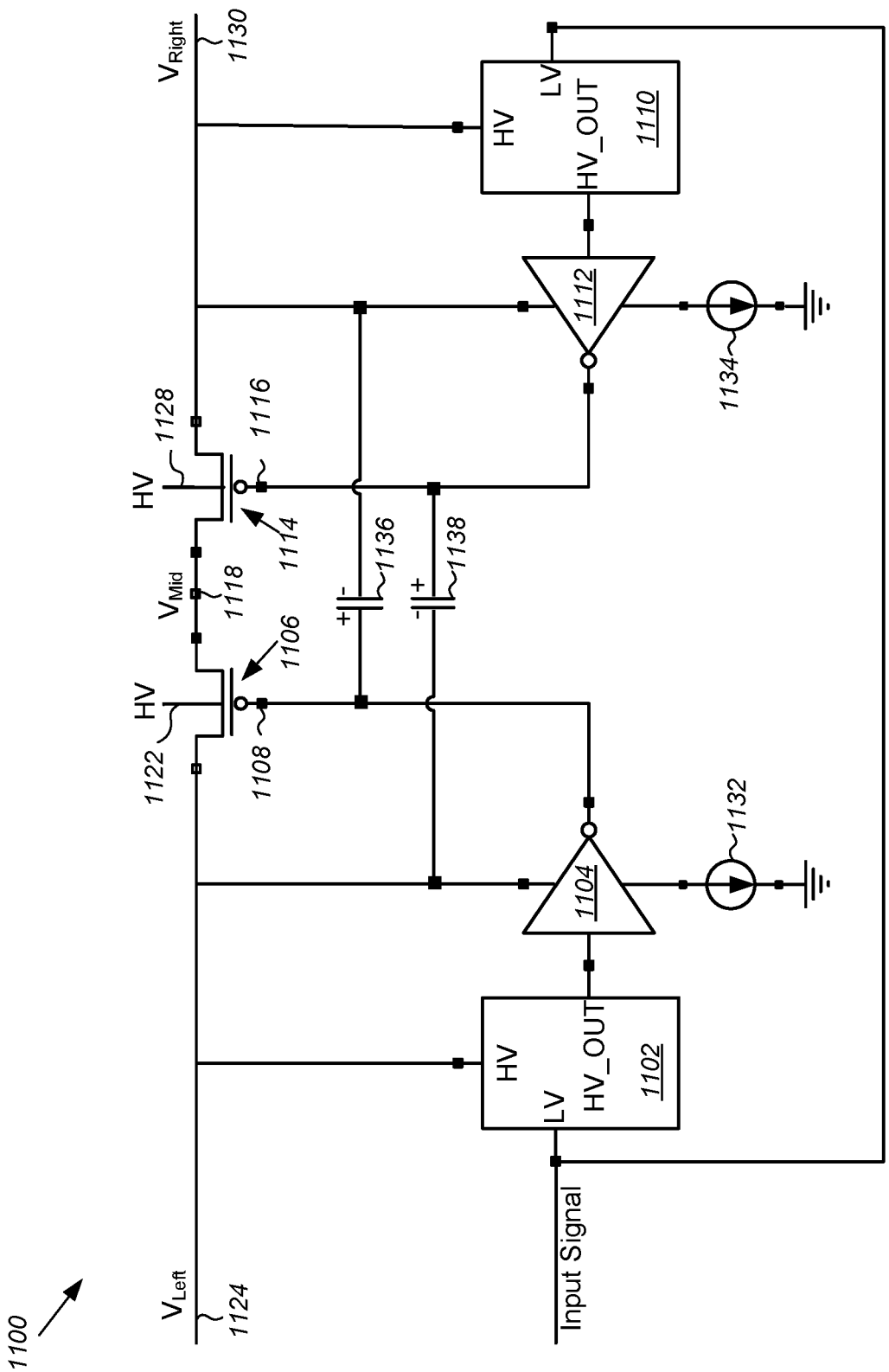
FIG. 11 is a schematic block diagram of another embodiment of a differential-slope limiting switch in which the wells or body terminals of the transistors are tied to a fixed, voltage.

($V_{Right}$), and the switch 1000 operates similarly and symmetrically to the case described above with respect to FIG. 10E, with the difference that $V_{Left}$ is ramped-up and $V_{Right}$ is ramped-down FIG. 11 is a schematic block diagram of another embodiment of a differential-slope limiting switch. Referring to FIG. 11, the differential-slope limiting switch 1100 includes a first level-shifter 1102 coupled to a first inverter 1104, a first FET 1106, having a gate 1108 coupled to an output of the first inverter, a second level-shifter 1110 coupled to a second inverter 1112, and a second transistor or FET 1114 having a gate 1116 coupled to an output of the second inverter. A drain of the first FET 1106 is coupled to a drain of the second FET 1114 at a node 1118. A source 1120 of the first FET 1106 is coupled to a first port 1124 of the switch, and a source 1126 of the second FET 1114 is coupled to a second port 1130.

As in the embodiment of FIG. 4 the switch 1100 further incorporates a dual side symmetrical ramp-control mechanism configured to provide a seamless, bi-directional, self-aligned differential-voltage transition slope-limit across the closed switch 1100. Generally, the dual side symmetrical ramp-control mechanism includes, in addition to the first and second FETs 1106, 1114, a first current-source 1132 coupled to the first inverter 1104, a second current-source 1134 coupled to the second inverter 1112, a first feedback/integration capacitance element, such as a capacitor 1136, coupled between the gate 1108 of the first FET 1106 and the second port 1130, and a second feedback/integration capacitor 1138 coupled between the gate 1116 of the second FET 1114 and the first port 1124 of the switch 1100.

Unlike in the embodiment of FIG. 4 the wells or body terminals 1122, 1128, of the transistors 1106, 1114, are tied to a fixed, high voltage (HV), such as a regulated input voltage applied to an input port (1124 or 1130) of the switch 1100, which is greater than or equal to the highest voltage ($V_{Left}$, $V_{Right}$) applied to either port. Advantages of this embodiment include reduction or substantial elimination of the risk of the transistors 1106, 1114, being unintentionally or inadvertently forward biased, since the wells or body terminals are biased higher than the source or drain regions.

Figure 12:
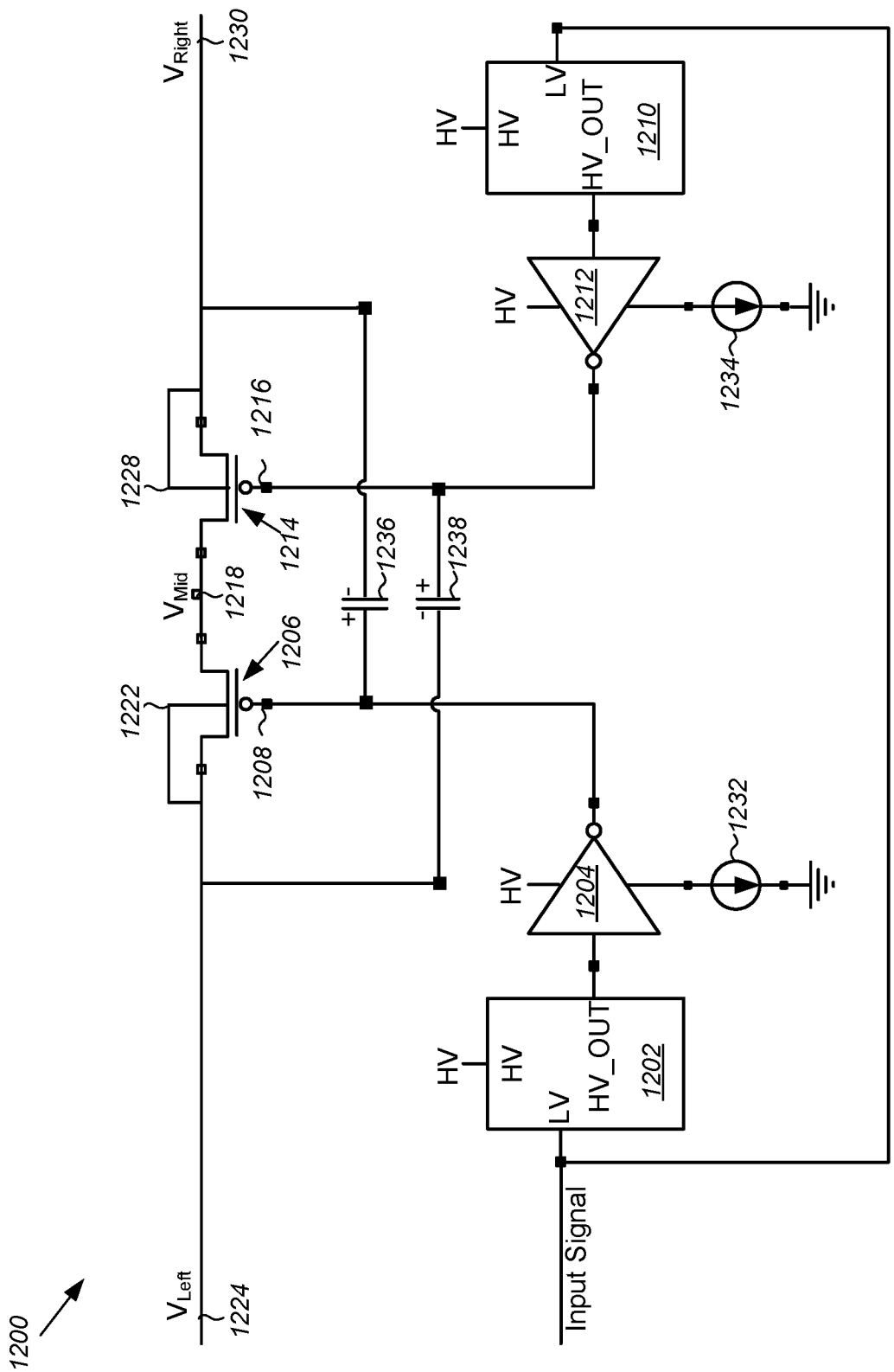
FIG. 12 is a schematic block diagram of another embodiment of a differential-slope limiting switch in which the inverters are tied to a high voltage to disable the switch at voltages greater or equal to the highest voltage on either port.

FIG. 12 is a schematic block diagram of yet another embodiment of a differential-slope limiting switch. Referring to FIG. 12, the differential-slope limiting switch 1200 includes a first level-shifter 1202 coupled to a first inverter 1204, a first FET 1206, having a gate 1208 coupled to an output of the first inverter, a second level-shifter 1210 coupled to a second inverter 1212, and a second transistor or FET 1214 having a gate 1216 coupled to an output of the second inverter. A drain of the first FET 1206 is coupled to a drain of the second FET 1214 at a node 1218. A source 1220 of the first FET 1206 is coupled to a first port 1224 of the switch, and a source 1226 of the second FET 1214 is coupled to a second port 1230.

As in the embodiments of FIGS. 4 and 11 the switch 1200 further incorporates a dual side symmetrical ramp-control mechanism. Generally, the dual side symmetrical ramp-control mechanism includes, in addition to the first and second FETs 1206, 1214, a first current-source 1232 coupled to the first inverter 1204, a second current-source 1234 coupled to the second inverter 1212, a first feedback/integration capacitance element, such as a capacitor 1236, coupled between the gate 1208 of the first FET 1206 and the second port 1230, and a second feedback/integration capacitor 1238 coupled between the gate 1216 of the second FET 1214 and the first port 1224 of the switch 1200.

Unlike in the embodiment of FIG. 4 in which the first level-shifter 406 and inverter 430 are coupled to the first port 402 and the second level-shifter 408 and inverter 434 are coupled to the second port 404, the first and second level-shifters 1202, 1210, and inverters 1204, 1212, in this embodiment are tied to a fixed, high voltage (HV) to disable the switch 1200 at input voltages to either the first or the second ports 1224, 1230, greater than the HV. Generally, the fixed HV is selected to be greater than or equal to the highest voltage ($V_{Left}$, $V_{Right}$) expected to be applied to either port, such as a regulated input voltage applied to an input port (1224 or 1230) of the switch 1200.

Figure 13A:
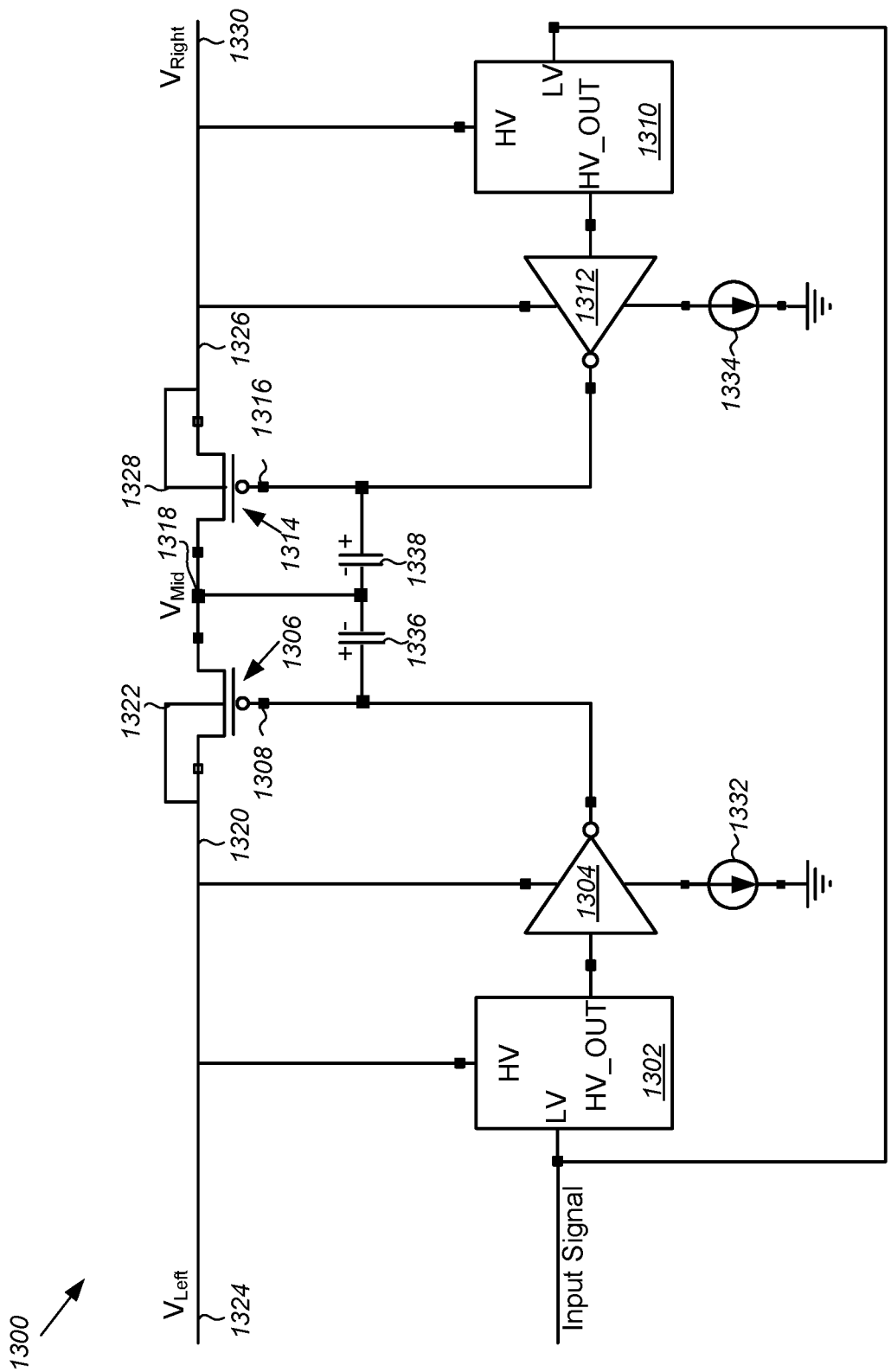
FIG. 13A is a schematic block diagrams of another embodiment of a differential-slope limiting switch wherein the capacitance elements are coupled to a node between transistors in the switch.
Figure 13B:
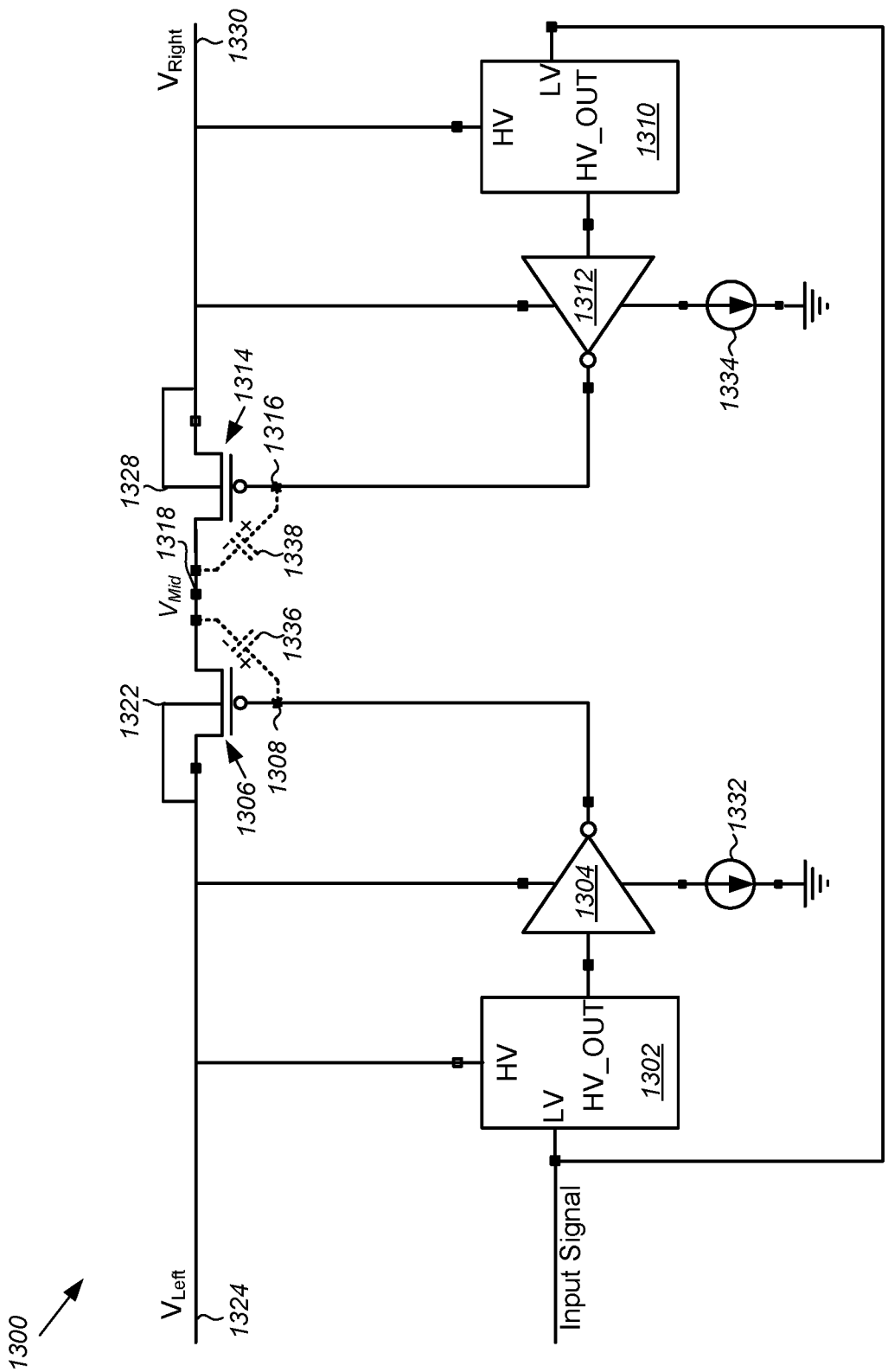
FIG. 13B is a schematic block diagrams of another embodiment of a differential-slope limiting switch in which a drain-to-gate capacitance ($C_{GD}$) of the transistors function as feedback capacitance elements.

FIGS. 13A and 13B are schematic block diagrams of another embodiment of a differential-slope limiting. Referring to FIG. 13A, the differential-slope limiting switch 1300 includes a first level-shifter 1302 coupled to a first inverter 1304, a first FET 1306, having a gate 1308 coupled to an output of the first inverter, a second level-shifter 1310 coupled to a second inverter 1312, and a second transistor or FET 1314 having a gate 1316 coupled to an output of the second inverter. A drain of the first FET 1306 is coupled to a drain of the second FET 1314 at a node 1318. A source 1320 of the first FET 1306 is coupled to a first port 1324 of the switch, and a source 1326 of the second FET 1314 is coupled to a second port 1330.

As in the embodiment of FIG. 4, the switch 1300 further includes a first current-source 1332 coupled to the first inverter 1304, and a second current-source 1334 coupled to the second inverter 1312, and first and second, capacitance elements 1336, 1338, for feedback and integration. Unlike in the embodiment of FIG. 4 the first and second, capacitance elements 1336, 1338, coupled to a voltage ($V_{Mid}$) on the node 1318 between the drains of the first and second FETs 1306, 1314.

FIG. 13B is a schematic block diagram of another embodiment of the differential-slope limiting switch 1300 of FIG. 13A in which the first and second capacitance elements 1336, 1338, do not include discreet, physical elements, such as metal capacitors, but rather are formed from an intrinsic capacitance ($C_{GD}$) formed between the gates and drains ($C_{GD}$) of substantially equally sized first and second FETs 1306, 1314. Advantages of this embodiment include a smaller, less complex and costly implementation of the switch 1300 due to the reduction in components.

Figure 14:
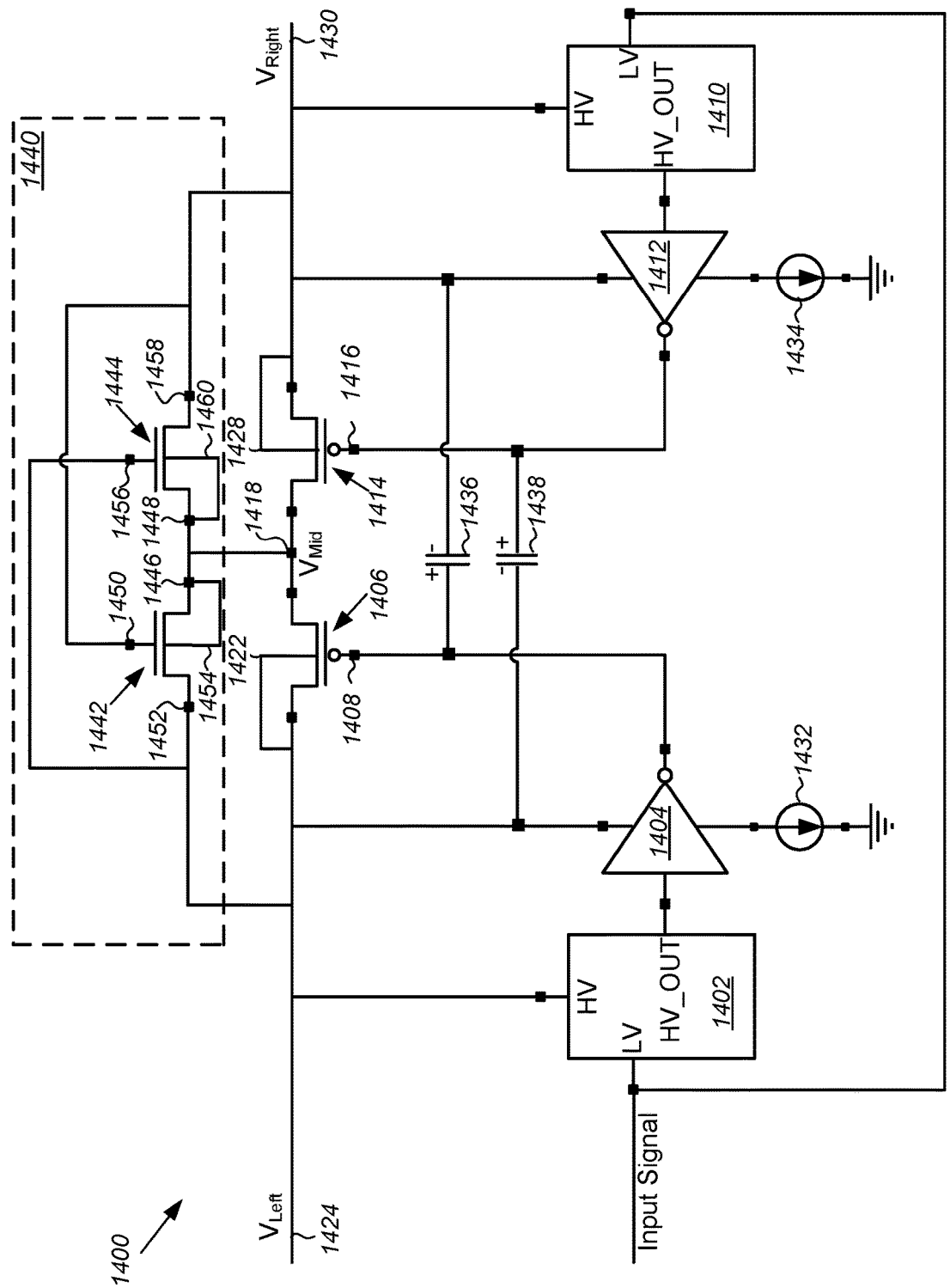
FIG. 14 is a schematic block diagram of an embodiment of a differential-slope limiting switch further including a lowest voltage selector coupled between the first and second ports of the switch and a middle node of the switch and providing enhanced forward bias protection.

FIG. 14 is a schematic block diagram of an embodiment of a differential-slope limiting switch 1400 further including a lowest voltage selection circuit or selector for enhanced pull-down of a voltage ($V_{Mid}$) at the middle node of the switch, and to provide enhanced forward bias protection. The forward bias protection is enhanced by coupling $V_{Mid}$ (at node 1418) to the lowest voltage of the two ports 1424, 1430 of the switch 1400, which prevents $V_{Mid}$, which, in the embodiment shown is connected to P-type drain regions or terminals of the first and second FETS 1406, 1414, from significantly rising above their n-well body terminals 1422, 1428, and forward biasing the P/N junctions formed by the drain and body terminals of the first and second FETs.

Referring to FIG. 14, the differential-slope limiting switch 1400 includes a first level-shifter 1402 coupled to a first inverter 1404, a first FET 1406, having a gate 1408 coupled to an output of the first inverter, a second level-shifter 1410 coupled to a second inverter 1412, and a second transistor or FET 1414 having a gate 1416 coupled to an output of the second inverter. A drain of the first FET 1406 is coupled to a drain of the second FET 1414 at a node 1418. A source 1420 of the first FET 1406 is coupled to the first port 1424 of the switch, and a source 1426 of the second FET 1414 is coupled to the second port 1430.

As in the embodiment of FIG. 4, the switch 1400 further incorporates a dual side symmetrical ramp-control mechanism. Generally, the dual side symmetrical ramp-control mechanism includes, in addition to the first and second FETs 1406, 1414, a first current-source 1432 coupled to the first inverter 1404, a second current-source 1434 coupled to the second inverter 1412, a first feedback/integration capacitance element, such as a capacitor 1436, coupled between the gate 1408 of the first FET 1406 and the second port 1430, and a second feedback/integration capacitor 1438 coupled between the gate 1416 of the second FET 1414 and the first port 1424 of the switch 1400.

Unlike in the embodiment of FIG. 4, the switch 1400 further includes a lowest voltage selector 1440 for enhanced pull-down of a voltage ($V_{Mid}$) at the middle node 1418 of the switch, and to provide enhanced forward bias protection. In the embodiment shown the lowest voltage selector 1440 includes third and fourth transistors, such as FETs 1442, 1444, coupled in series with one another through sources 1446, 1448 and to the middle node 1418, and coupled in parallel with the first and second FETs 1406, 1414 of the switch 1400. The third FET 1442 further includes a gate 1450 coupled to the second port 1430 of the switch 1400, a drain 1452 coupled to the first port 1424, and a body terminal 1454 coupled to its source 1446 and to the middle node 1418. The fourth FET 1444 further includes a gate 1456 coupled to the second port 1430 of the switch 1400, a drain 1458 coupled to the first port 1424, and a body terminal 1460 coupled to its source 1448 and to the middle node 1418.

Generally, the third and fourth FETs 1442, 1444, include oppositely doped channels relative to the first and second FETs 1406, 1414. In the embodiment shown the third and fourth FETs 1442, 1444, include n-channel metal-oxide-semiconductor field-effect-transistors (NMOS) transistors, and the first and second FETs 1406, 1414 include p-channel (PMOS) transistors. It is noted that the combination of NMOS and PMOS switches in parallel will allow full-swing from zero volts up to a highest voltage (HV) supplied or coupled to the switch 1400, which is not possible with the usage of only one type of FET. However as with the differential-slope limiting switch 400 in the embodiment of FIG. 4, it will be understood that the switch 1400 including the lowest voltage selector 1440 can also be implemented using NMOS for the first and second FETs 1406, 1414 and PMOS for the third and fourth FETs 1442, 1444, with an appropriate selection of bias and voltages without departing from the breadth and scope of the present invention.

Figure 15:
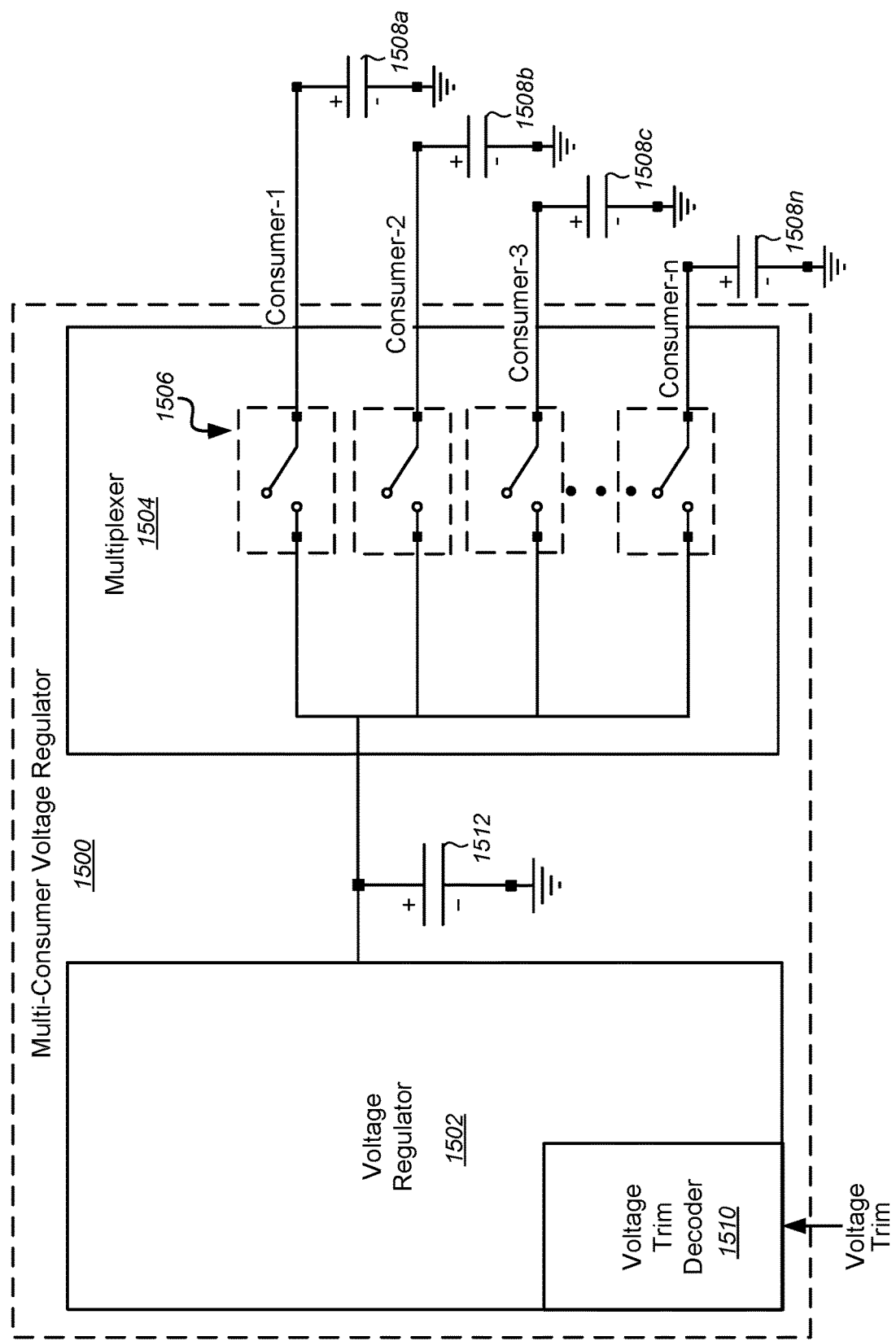
FIG. 15 is a schematic block diagram of an embodiment of a multi-consumer voltage regulator for driving multiple consumers through a multiplexer.

It will be understood that the embodiments of the differential-slope limiting switches described above are suitable for a wide range of high-voltage applications in which a voltage change across a closed switch must not yield high transition slopes. In particular, it is noted that the switches described above are especially useful when used in conjunction with a voltage regulator and multiplexer to implement a multi-consumer voltage regulator for driving multiple consumers. FIG. 15 is a schematic block diagram of one such embodiment of a multi-consumer voltage regulator. Referring to FIG. 15, a multi-consumer voltage regulator 1500 includes a voltage regulator 1502, such as a digital to analog (D→A) regulator, for receiving and/or generating a regulated output voltage ($V_{reg}$), and a multiplexer 1504 including a multiple differential-slope limiting switches 1506, represented in this figure by a schematic switch symbol, coupling the regulated output voltage to multiple consumers (consumer-1 through n) having a capacitive load, represented here schematically as load capacitors 1508*a-n*. The switches 1506 can include any of the embodiments of a differential-slope limiting switches described above.

Generally, as in the embodiment shown, the voltage regulator 1502 further includes a voltage trim decoder 1510 for receiving a voltage trim signal and adjusting or trimming the regulated output voltage over a predetermined range. Additionally, in some embodiments the multi-consumer voltage regulator 1500 further includes an output capacitor 1512 coupled between the output of the voltage regulator 1502 and ground. Unlike in conventional analog switches used to couple consumers to a voltage regulator, the output capacitor 1512 does not need to have a capacitance larger than the capacitance 1508*a-n* of any of the multiple consumers coupled to the voltage regulator 1502. On the contrary, using the differential slope limiting switches 1506 in the multiplexer 1504 enables the output capacitor 1512 to have wide range capacitances either in a higher or lower relative to the capacitance 1508*a-n* of any of the multiple consumers coupled to the voltage regulator 1502. This is especially advantageous since capacitors 1508*a-n* can have dynamically changing capacitances over a wide range of load capacitances. In particular, it is noted that capacitors 1508*a-n* of the multiple consumers can change either before or after the consumer connects to the voltage regulator, or even during voltage transitions across the switch 1506, without substantial impact on the transition slope. Moreover, provided the voltage regulator 1502 is sufficiently strong enough to ramp-up/ramp-down to voltages required by all of the multiple consumers at the required currents, a smaller output capacitor 1512 can be advantageous for faster voltage transition of the voltage regulator output, once its input trim is significantly changed. Since, the output capacitor 1512 does not effect a voltage transition of any newly connected consumers, and since the differential slope limiting switches 1506 limit the output current that the voltage regulator 1502 needs to drive an added consumer, both a smaller output capacitor 1512 and a weaker voltage regulator can be used.

FIGS. 16A and 16B are wave diagrams comparing the effect on a multi-consumer voltage regulator of adding a new high-capacitive consumer for a multi-consumer voltage regulator using conventional analog switches versus a voltage regulator using differential-slope limiting switches.

FIG. 16A illustrates a regulated output voltage ($V_{reg}$), and voltages coupled to three consumers through a multiplexer including conventional analog switches. Referring to FIG. 16A at a time prior to t1 enable signals (En Consumer-2 and En Consumer-3) are supplied to two separate analog switches to couple Consumer-2 and Consumer-3 to the voltage regulator. The regulated output voltage ($V_{reg}$) and the voltages on the consumer side or port of the conventional analog switches coupling Consumer-2 and Consumer-3 to the regulator output are all substantially 10 v. At time t1 an enable signal (En Consumer-1) is asserted to a third conventional analog switch coupling Consumer-1 to the regulator output. Because in this example Consumer-1 it is at a voltage of 6 v prior to time t1 and has a high capacitance relative to Consumer-2 and Consumer-3, and to the regulator output, $V_{reg}$ and voltages coupled to Consumer-2 and Consumer-3 drop at a high voltage slope 1602 of 5 v in 100 nsec as a result of charge sharing between the regulator output and Consumer-1, Consumer-2 and Consumer-3. The voltages on the regulator output, Consumer-2 and Consumer-3 do recover but at a much slower rate than that at which they initially dropped. In the example shown it takes about 1 μsec from time t2 to time t3 for the voltages to recover to 10 v.

More importantly the voltage regulator, Consumer-2 and Consumer-3 have been subjected to an uncontrolled and therefore undesirable high voltage-slope transition, and potentially damaging or disruptive under voltage conditions for Consumer-2 and Consumer-3.

FIG. 16B illustrates a regulated output voltage ($V_{reg}$), and voltages coupled to three consumers through a multiplexer including differential-slope limiting switches, such as described above. Referring to FIG. 16B, again at a time prior to t1 enable signals (En Consumer-2 and En Consumer-3) are supplied to two separate differential-slope limiting switches to couple Consumer-2 and Consumer-3 to the voltage regulator. The regulated output voltage ($V_{reg}$) and the voltages on the consumer side or port of the differential-slope limiting switches are all substantially 10 v. At time t1 an enable signal (En Consumer-1) is asserted to a third differential-slope limiting switch coupling Consumer-1 to the regulator output. As in the example of FIG. 18A, Consumer-1 is at a voltage of 6 v prior to time t1 and has a high capacitance relative to Consumer-2 and Consumer-3, and to the regulator output, $V_{reg}$. However, because of the slope-limiting characteristics of the differential-slope limiting switch coupling Consumer-1 to the regulator output, the voltage coupled to Consumer-1 increases with a controlled, limited voltage slope 1604 of 6 v in 1 μsec. As explained previously with respect to FIG. 4 the absolute magnitude of the limited voltage slope is determined by a current supplied by current-sources in the differential-slope limiting switch divided by capacitance of feedback capacitors in the switch. Moreover, as shown graphically in FIG. 16B neither the voltage regulator, Consumer-2 or Consumer-3 are subjected to a high voltage-slope transition or indeed any voltage transition in this example, nor are Consumer-2 and Consumer-3 subjected to potentially damaging or disruptive under voltage conditions.

Figure 17:
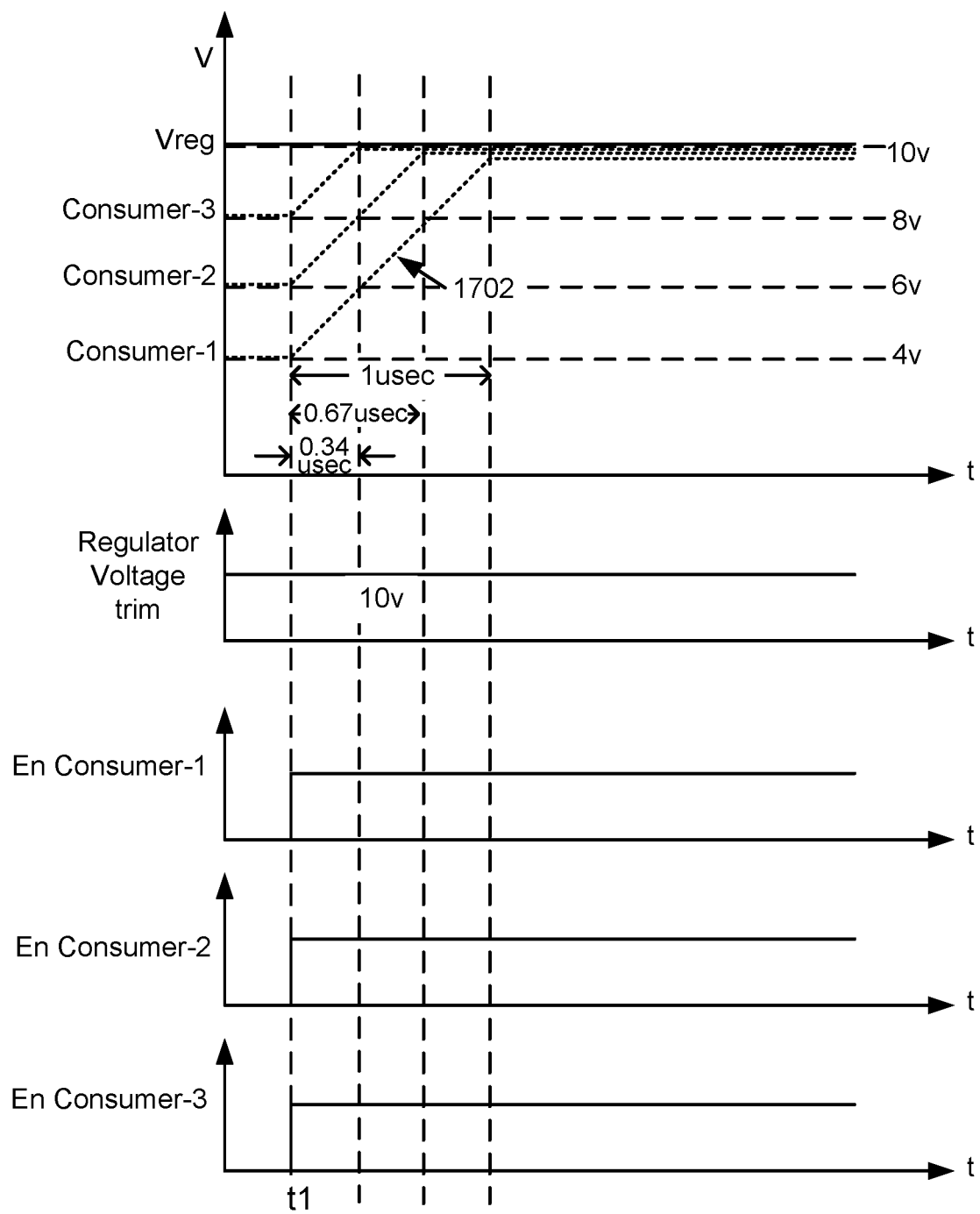
FIG. 17 is a wave diagram graphically illustrating a process of simultaneously connecting a voltage regulator to multiple new consumers with different voltages lower than a regulated voltage through a multiplexer including differential-slope limiting switches.

FIG. 17 is a wave diagram graphically illustrating a process of simultaneously connecting a voltage regulator to multiple new consumers with different voltages lower than a regulated voltage through a multiplexer including differential-slope limiting switches, such as described above. Referring to FIG. 17, at a time prior to t1 the regulator output voltage (Vreg) is 10 v. The voltage on the consumer side or port of the differential-slope limiting switches for Consumer-1 is 4 v, for Consumer-2 is 6 v and for Consumer-3 is 8 v. At time t1 enable signals (En Consumer-1, En Consumer-2 and En Consumer-3) are supplied to three separate differential-slope limiting switches to couple Consumer-1, Consumer-2 and Consumer-3 to the regulator output voltage (Vreg). Because of the slope-limiting characteristics of the differential-slope limiting switches, the voltages coupled to all three consumers increases or ramps-up at substantially equal, controlled constant voltage slope 1702, of 6 v in 1 usec. Despite the differences in initial voltages, or differences in capacitive loads, there is no charge sharing, and none of the three consumers or the voltage regulator is subjected to a high voltage-slope transition or potentially damaging or disruptive under voltage conditions.

Figure 18:
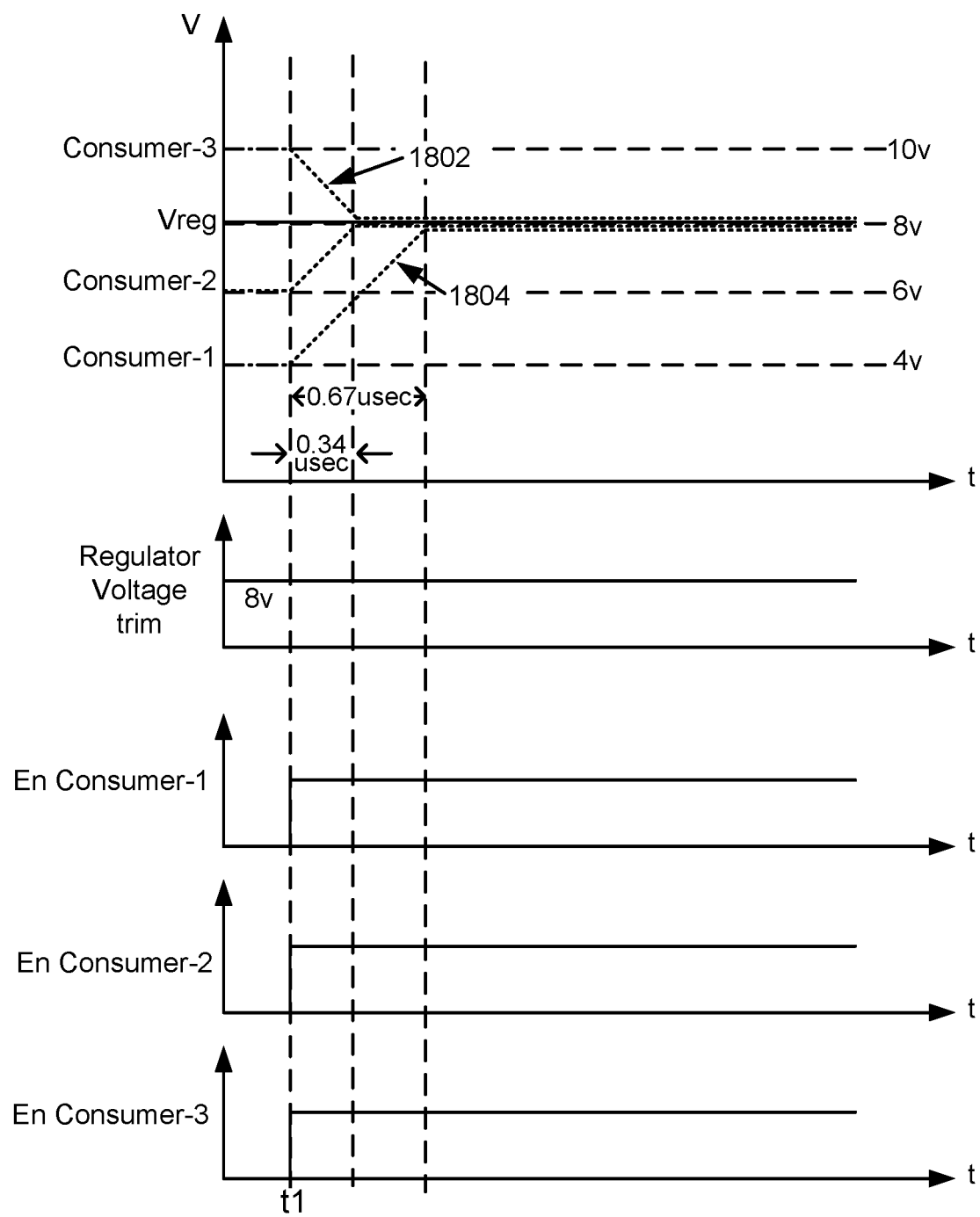
FIG. 18 is a wave diagram graphically illustrating a process of simultaneously connecting a voltage regulator to multiple new consumers with different voltages above and below a regulated voltage through a multiplexer including differential-slope limiting switches.

FIG. 18 is a wave diagram graphically illustrating a process of simultaneously connecting a voltage regulator to multiple new consumers with different voltages above and below a regulated voltage through a multiplexer including differential-slope limiting switches. Referring to FIG. 18, at a time prior to t1 the regulator output voltage (Vreg) is 8 v. The voltage on the consumer side or port of the differential-slope limiting switches for Consumer-1 is 4 v, for Consumer-2 the voltage is 6 v and for Consumer-3 the voltage is 10 v. At time t1 enable signals (En Consumer-1, En Consumer-2 and En Consumer-3) are supplied to three separate differential-slope limiting switches to couple Consumer-1, Consumer-2 and Consumer-3 to the regulator output voltage (Vreg). The voltage on Consumer-3 begins to decrease or ramp-down at a controlled and constant limited ramp-down voltage slope 1802, while simultaneously the voltages on Consumer-1 and Consumer-2 begin to increase or ramp-up at a controlled and constant limited ramp-up voltage slope 1804. The regulator output voltage (Vreg) remains unchanged at 8 v. Moreover, because of the slope-limiting characteristics of the differential-slope limiting switches, the absolute magnitude of the limited ramp-down voltage slope 1802 and the limited ramp-up voltage slope 1804 are substantially equal. Despite the differences in initial voltages, or differences in capacitive loads, there is no charge sharing, and none of the three consumers or the voltage regulator is subjected to a high voltage-slope transition or potentially damaging or disruptive under voltage conditions.

Figure 19:
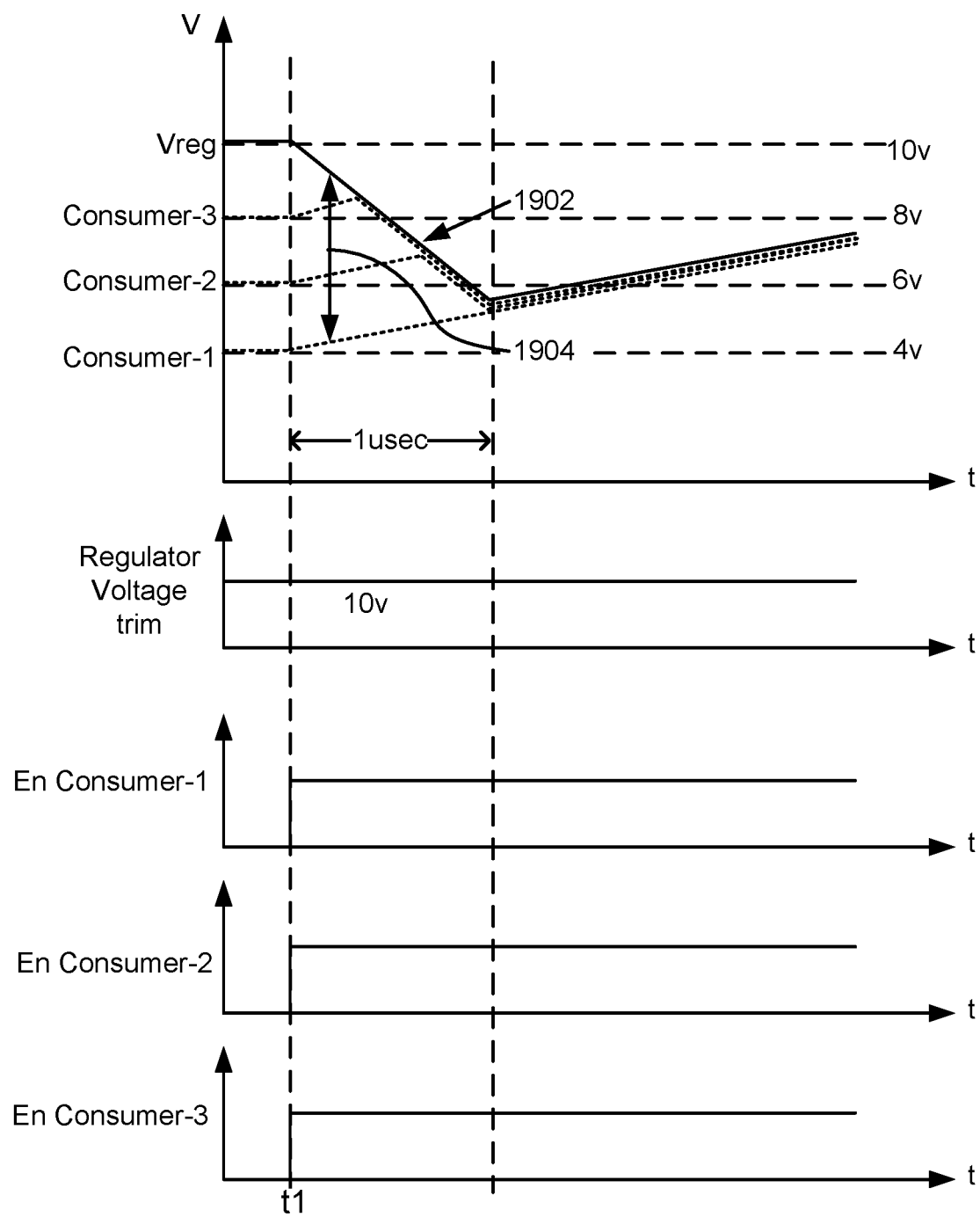
FIG. 19 is a wave diagram graphically illustrating a process of simultaneously connecting a voltage regulator to multiple new consumers with different voltages through a multiplexer including differential-slope limiting switches where a capacitive load of one of the consumers is substantially greater than that of the regulator and other consumers.

FIG. 19 is a wave diagram graphically illustrating a process of simultaneously connecting a voltage regulator to multiple new consumers with different voltages through a multiplexer including differential-slope limiting switches where all three of the consumers are at different initial voltages a capacitive load of one of the consumers (Consumer-1) is substantially greater than that of both the regulator and the other consumers, and the voltage regulator is not strong enough (current-wise) to support a transition of 6 v/1 usec for consumer-1. Referring to FIG. 19, at a time prior to t1 the regulator output voltage (Vreg) is 10 v, the voltage on the consumer side or port of the differential-slope limiting switches for Consumer-1 is 4 v, for Consumer-2 the voltage is 6 v and for Consumer-3 the voltage is 10 v. A capacitive load of Consumer-1 is much greater than a capacitive loads of the voltage regulator, Consumer-2 and Consumer-3 ($C_1 \gg (C_{REG, C2, C3})$). At time t1 enable signals (En Consumer-1, En Consumer-2 and En Consumer-3) are supplied to three separate differential-slope limiting switches to couple Consumer-1, Consumer-2 and Consumer-3 to the regulator output voltage (Vreg). The voltage on the regulator output (Vreg) begins to decrease or ramp-down immediately but at a controlled and constant limited voltage slope 1902, while simultaneously the voltages on Consumer-1, Consumer-2 and Consumer-3 begin to increase or ramp-up. Although the absolute magnitudes of the slopes at which the voltages on Consumer-1, Consumer-2 and Consumer-3 increase are less than the limited voltage slope 1902 of the ramp-down of Vreg, it is noted that Vreg and consumer voltages are ramping towards each other with a limited-differential-slope 1904 of about 6 MV/sec, and are not experiencing high voltage-slopes transitions.

A method for operating a multi-consumer voltage regulator having a multiplexer including differential-slope limiting switches will now be described with reference to the flowchart of FIG. 20. Referring to FIG. 20 the method begins with coupling a regulator voltage to a multiplexer in the multi-consumer voltage regulator including a multiple differential-slope limiting switches (2002). A first consumer at a first voltage is then coupled to the regulator voltage at a first time through a first one of the multiple differential-slope limiting switches by applying a signal to close the switch, and a slope of a voltage transition across the switch limited (2004). As explained above, the voltage slope across differential-slope limiting switches is determined and limited by a current supplied by current-sources in the differential-slope limiting switch divided by capacitance of feedback capacitors in the switch. Next, at a second time a second consumer at a second voltage is coupled to the regulator voltage through a second differential-slope limiting switch, and a slope of a voltage transition across the second switch is limited. (2006). Generally each of the differential-slope limiting switches include a first transistor having a source coupled to a first port of the switch, a second transistor having a source coupled to a second port of the switch and a drain coupled to a drain of the first transistor. Finally, in some embodiments the differential-slope limiting switches further include a lowest-voltage selection circuit or selector coupled between the first and second ports of the switch, and the method further includes coupling with the lowest-voltage selector a node between the drains (or sources depending on the switch configuration and biasing) of the first and second transistors to the port of the switch at a lowest voltage, whereby a forward-bias condition is prevented (2008).

A method for operating a differential-slope limiting switch will now be described with reference to the flowchart of FIG. 21. A method for operating a differential-slope limiting switch will now be described with reference to the flowchart of FIG. 21. It is noted that while the following steps are listed or recited in order, it is not necessary that all of the steps be performed sequentially in that order. Rather, some of the steps may be performed substantially simultaneously, while others may be performed sequentially thereafter.

Figure 21:
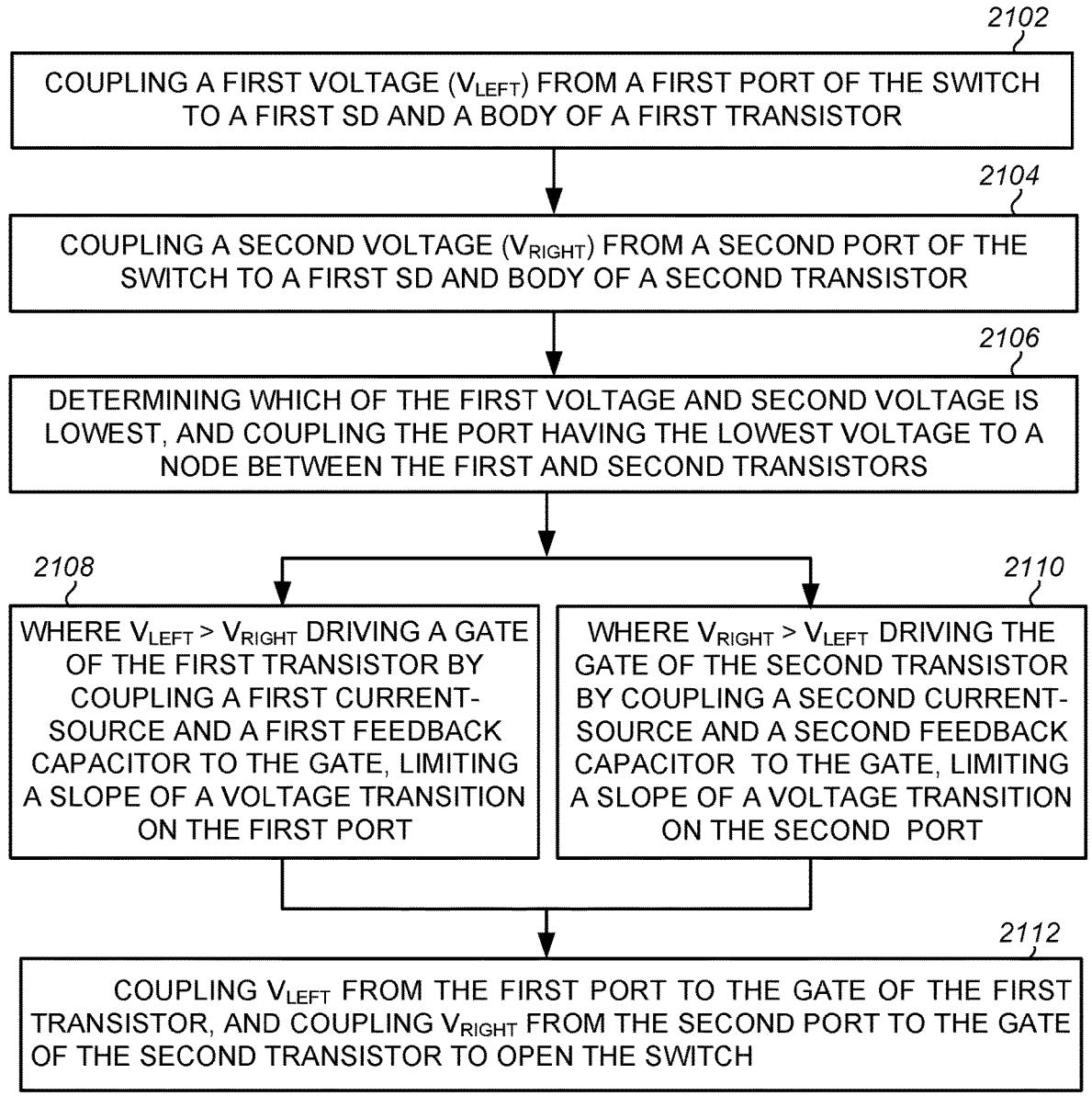
FIG. 21 is a flowchart of a method for operating a differential-slope limiting switch.

Referring to FIG. 21 the method begins with coupling a first voltage ($V_{Left}$) from a first port of the switch to a first source-drain (SD) terminal and a body terminal of a first transistor in the switch (2102). A second voltage ($V_{Right}$) is substantially simultaneously coupled from a second port of the switch to a first SD terminal and a body terminal of a second transistor of the switch (2104).

Optionally, where the switch further includes a lowest-voltage-selector the method of operating the switch to close the switch further includes determining which of the first voltage and second voltage is lowest, and coupling the first or the second port having the lowest voltage to a node between the second SD terminal of the first transistor and the second terminal of the second transistor (2106).

Next, a switch enable signal is applied to close the switch. Where $V_{Left}$ is greater than $V_{Right}$, the switch is closed by driving a gate of the first transistor by coupling a first current-source and a first feedback capacitor coupled between the gate of the first transistor and the second port to the gate to limit a slope of a voltage transition on the first port relative to a slope of a voltage transition on the second port (2108). The slope of the voltage transition on the first port is limited by the current source and feedback capacitance ($I_{CURRENT\_SOURCE}/C_{FEEDBACK}$). The slope of the voltage transition on the second port is not the limiting factor, and is less than or equal to the slope on the first port.

Where $V_{Right}$ is greater than $V_{Left}$, the switch is closed by driving a gate of the second transistor by coupling a second current-source and a second feedback capacitor coupled between the gate of the second transistor and the first port to the gate while limiting a slope of a voltage transition on the second port relative to a slope of a voltage transition on the first port (2110). In this case, it is the slope of the voltage transition on the first port which is not limiting, and is generally less than or equal to the slope on the second port.

In both cases, i.e., where $V_{Left} > V_{Right}$ and where $V_{Right} > V_{Left}$, the differential-slope of a voltage transition across the switch is equal to a sum of absolute values of the voltage transitions on the first port and the second port.

The switch can then be opened by coupling $V_{Left}$ from the first port to the gate of the first transistor and coupling $V_{Right}$ from the second port to the gate of the second transistor (2112).

Thus, differential-slope limiting switches, multi-consumer voltage regulator including such switches and methods for operating the same have been disclosed. Embodiments of the present invention have been described above with the aid of functional and schematic block diagrams illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

It is to be understood that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The breadth and scope of the present invention should not be limited by any of the above-described exemplary embodiments, but should be defined only in accordance with the following claims and their equivalents.

What is claimed is:

1. A differential-slope limiting switch comprising:
    a first transistor including a first source-drain (SD) terminal and a body terminal coupled to a first port of the switch, a gate, and a second SD terminal;
    a second transistor including a first SD terminal and a body terminal coupled to a second port of the switch, a gate, and a second SD terminal coupled to the second SD of the first transistor;
    a first selector-circuit coupled to the gate of the first transistor, to a voltage received on the first port ($V_{Left}$), and to a first current-source, the first selector-circuit configured to couple the gate of the first transistor to the first current-source when a switch-enable (switch_en) signal to close the switch is received by the first selector-circuit, and to $V_{Left}$ when the switch_en signal is not received; and
    a second selector-circuit coupled to the gate of the second transistor, to a voltage received on the second port ($V_{Right}$), and to a second current-source, the second selector-circuit configured to couple the gate of the second transistor to the second current-source when the switch_en signal is received by the second selector-circuit, and to $V_{Right}$ when the switch_en signal is not received.

2. The switch of claim 1 further comprising a first capacitive element coupled to the gate of the first transistor, and a second capacitive element coupled to the gate of the second transistor,
wherein the first and second capacitive elements and the first and second current-sources are configured to limit a slope of a voltage transition across the switch when closed.

3. The switch of claim 2 wherein the first capacitive element comprises a first capacitor coupled between the gate of the first transistor and the second port of the switch, and the second capacitive element comprises a second capacitor coupled between the gate of the second transistor and the first port of the switch.

4. The switch of claim 2 wherein the first capacitive element comprises a first capacitor coupled to the gate of the first transistor and between the second SD of the first transistor and the second SD of the second transistor, and the second capacitive element comprises a second capacitor coupled to the gate of the second transistor and between the second SD of the first transistor and the second SD of the second transistor.

5. The switch of claim 2 further including a lowest-voltage-selector coupled between the first and second ports, and to a node between the second SD of the first transistor and the second SD of the second transistor configured to couple the node to a lowest voltage on the first or second port to prevent forward-biasing of the first or second transistor coupled to the first or second port at the lowest voltage.

6. The switch of claim 5 wherein the lowest-voltage-selector comprises a third transistor and a fourth transistor coupled in series with one another, and in parallel with the first transistor and the second transistor, wherein:
the third transistor has a first SD coupled to a first SD of the fourth transistor and to the node between the first and second transistors, a second SD coupled to the first port of the switch, and a gate coupled to the second port of the switch; and
the fourth transistor has a second SD coupled to the second port of the switch, and a gate coupled to the first port of the switch.

7. The switch of claim 6 further comprising a first level-shifter coupled to the first inverter and to $V_{Left}$, and a second level-shifter coupled to the second inverter and to $V_{Right}$, each of the first and second level shifters configured to receive a low voltage (LV) input signal and to output a high voltage (HV) switch_en signal to the first or second inverter coupled thereto.

8. The switch of claim 1 wherein the first selector-circuit comprises a first inverter and the second selector-circuit comprises a second inverter.

9. A multi-consumer voltage regulator comprising:
a regulator having a voltage output; and
a multiplexer having an input coupled to the voltage output and a plurality of differential-slope limiting switches each comprising a first port coupled to the input of the multiplexer and a second port coupled to one of a plurality of consumers, wherein each of the plurality of differential-slope limiting switches comprises:
a first transistor including a first source-drain (SD) terminal and a body terminal coupled to a first port of the switch, a gate, and a second SD terminal;
a second transistor including a first SD terminal and a body terminal coupled to a second port of the switch, a gate, and a second SD terminal coupled to the second SD of the first transistor;
wherein each of the plurality of differential-slope limiting switches is configured to limit current through the switch so a slope of a voltage transition across a closed first one of the plurality of differential-slope limiting switches is limited and substantially equal to a slope of a voltage transition across the remaining plurality of differential-slope limiting switches when closed.

10. The voltage regulator of claim 9 wherein each of the plurality of differential-slope limiting switches further comprises:
a first selector-circuit coupled to the gate of the first transistor, to a voltage received on the first port ($V_{Left}$), and to a first current-source, the first selector-circuit configured to couple the gate of the first transistor to the first current-source when a switch-enable (switch_en) signal to close the switch is received by the first selector-circuit, and to $V_{Left}$ when the switch_en signal is not received;
a second selector-circuit coupled to the gate of the second transistor, to a voltage received on the second port ($V_{Right}$), and to a second current-source, the second selector-circuit configured to couple the gate of the second transistor to the second current-source when the switch_en signal is received by the second selector-circuit, and to $V_{Right}$ when the switch_en signal is not received;
a first capacitive element coupled to the gate of the first transistor, and a second capacitive element coupled to the gate of the second transistor,
wherein the first and second capacitive elements and the first and second current-sources are configured to limit a slope of a voltage transition across the switch when closed, and to prevent high voltage slope (or uncontrolled) charge sharing between an input capacitance coupled to the first port and a load capacitance coupled to the second port.

11. The voltage regulator of claim 10 wherein the first capacitive element comprises a first capacitor coupled between the gate of the first transistor and the second port of the switch and the second capacitive element comprises a second capacitor coupled between the gate of the second transistor and the first port of the switch.

12. The voltage regulator of claim 10 wherein the first capacitive element comprises a first capacitor coupled to the gate of the first transistor and to a node between the second SD of the first transistor and the second SD of the second transistor, and the second capacitive element comprises a second capacitor coupled to the gate of the second transistor and the node between the second SDs of the first transistor and the second transistor.

13. The voltage regulator of claim 10 wherein each of the plurality of differential-slope limiting switches further comprises a lowest-voltage-selector coupled between the first and second ports, and to a node between the second SD of the first transistor and the second SD of the second transistor, the lowest-voltage-selector configured to couple the node to a lowest voltage on the first or second port to prevent forward-biasing of the first or second transistor coupled to the first or second port at the lowest voltage.

14. The voltage regulator of claim 13 wherein the lowest-voltage-selector comprises a third transistor and a fourth transistor coupled in series with one another, and in parallel with the first transistor and the second transistor, wherein:
the third transistor has a first SD coupled to a first SD of the fourth transistor and to the node between the first and second transistors, a second SD coupled to the first port of the switch, and a gate coupled to the second port of the switch; and the fourth transistor has a second SD coupled to the second port of the switch, and a gate coupled to the first port of the switch.

15. The voltage regulator of claim 10 wherein the first selector-circuit comprises a first inverter, and the second selector-circuit comprises a second inverter, and wherein each of the plurality of differential-slope limiting switches further comprises a first level-shifter coupled to the first inverter and to $V_{Left}$, and a second level-shifter coupled to the second inverter and to $V_{Right}$, each of the first and second level shifters configured to receive a low voltage (LV) input signal and to output a high voltage (HV) switch_en signal to the first or second inverter coupled thereto.

16. A method of operating a switch to limit a differential-slope of a voltage transition across the switch, the method comprising:

coupling a first voltage ($V_{Left}$) from a first port of the switch to a first source-drain (SD) terminal and a body terminal of a first transistor in the switch, the first transistor further including a gate, and a second SD terminal;

coupling a second voltage ($V_{Right}$) from a second port of the switch to a first SD terminal and a body terminal of a second transistor of the switch, the second transistor further including a gate, and a second SD terminal coupled to the second SD of the first transistor; and closing the switch, wherein where $V_{Left}$ is greater than $V_{Right}$, closing the switch comprises driving the gate of the first transistor by coupling a first current-source and a first feedback capacitor coupled between the gate of the first transistor and the second port while limiting a slope of a voltage transition on the first port relative to a slope of a voltage transition on the second port which is not limiting and is less than or equal to the slope on the first port, and the differential-slope of a voltage transition across the switch is equal to a sum of absolute values of the voltage transitions on the first port and the second port.

17. The method of claim 16 where $V_{Right}$ is greater than $V_{Left}$, and wherein closing the switch comprises driving the gate of the second transistor by coupling a second current-source and a second feedback capacitor coupled between the gate of the second transistor and the first port while limiting a slope of a voltage transition on the second port relative to the first port which is not limiting and is less than or equal to the slope on the first port, and the differential-slope of a voltage transition across the switch is equal to a sum of absolute values of the voltage transitions on the first port and the second port.

18. The method of claim 16 further comprising opening the switch by:

coupling $V_{Left}$ from the first port to the gate of the first transistor and the first feedback capacitive to open the switch; and coupling $V_{Right}$ from the second port to the gate of the second transistor and the second feedback capacitor to open the switch.

19. The method of claim 16 further comprising determining which of the first voltage and second voltage is lowest, and coupling the first or the second port having the lowest voltage to a node between the second SD terminal of the first transistor and the second SD terminal of the second transistor.

20. The method of claim 19 wherein the switch further includes a lowest-voltage-selector comprising a third transistor and a fourth transistor coupled in series with one another, and in parallel with the first transistor and the second transistor, the third transistor having a first SD coupled to a first SD of the fourth transistor and to the node between the first and second transistors.

\* \* \* \* \*